United States Patent
Kamon

(10) Patent No.: US 7,645,978 B2
(45) Date of Patent: Jan. 12, 2010

(54) IMAGE SENSING APPARATUS AND IMAGE SENSING METHOD USING IMAGE SENSOR HAVING TWO OR MORE DIFFERENT PHOTOELECTRIC CONVERSION CHARACTERISTICS

(75) Inventor: Koichi Kamon, Otokuni-gun (JP)

(73) Assignee: Konica Minolta Holdings, Inc., Tokyo (JP)

(*) Notice: Subject to any disclaimer, the term of this patent is extended or adjusted under 35 U.S.C. 154(b) by 0 days.

(21) Appl. No.: 12/061,125

(22) Filed: Apr. 2, 2008

(65) Prior Publication Data
US 2008/0251695 A1 Oct. 16, 2008

(30) Foreign Application Priority Data
Apr. 13, 2007 (JP) .............................. 2007-106388

(51) Int. Cl.
*H03G 3/20* (2006.01)
(52) U.S. Cl. .............................. 250/214 AG; 250/214 A
(58) Field of Classification Search ........... 250/214 AG, 250/208.1, 214 A, 214 L; 348/300
See application file for complete search history.

(56) References Cited

U.S. PATENT DOCUMENTS

2004/0227109 A1* 11/2004 Storm et al. ................. 250/551
2007/0007438 A1* 1/2007 Liu et al. ............... 250/214 AG

FOREIGN PATENT DOCUMENTS

JP 2006-352804 A 12/2006

* cited by examiner

*Primary Examiner*—Thanh X Luu
(74) *Attorney, Agent, or Firm*—Sidley Austin LLP

(57) ABSTRACT

An image sensing apparatus and an image sensing method of the invention are configured in such a manner that an image sensor having two or more different photoelectric conversion characteristics is used, a gain of image signals having the respective photoelectric conversion characteristics acquired by the image sensor is calculated based on the image signals having the respective photoelectric conversion characteristics, and gain control is performed with respect to each of the photoelectric conversion characteristics, using the calculated gain. This arrangement enables to control the imaging sensitivity without changing the dynamic range.

14 Claims, 15 Drawing Sheets

IMAGE SENSING APPARATUS AND IMAGE SENSING METHOD USING IMAGE SENSOR HAVING TWO OR MORE DIFFERENT PHOTOELECTRIC CONVERSION CHARACTERISTICS

This application is based on Japanese Patent Application No. 2007-106388 filed on Apr. 13, 2007, the contents of which are hereby incorporated by reference.

BACKGROUND OF THE INVENTION

1. Field of the Invention

The present invention relates to an image sensing apparatus incorporated with an image sensor having two or more different photoelectric conversion characteristics, as well as an image sensing method; and more particularly to an image sensing apparatus and an image sensing method that enable to control sensitivity with respect to image signals having different characteristics to be outputted from an image sensor.

2. Description of the Related Art

In recent years, in an image sensing apparatus such as a digital camera, as high-quality performance is demanded, a technology of expanding a luminance range i.e. a dynamic range of a subject image to be captured by an image sensor is required. In expanding the dynamic range, there is known an image sensor having different photoelectric conversion characteristics i.e. a linear characteristic that an electric signal is linearly converted with respect to an incident light amount and outputted, and a logarithmic characteristic that an electric signal is logarithmically converted with respect to an incident light amount and outputted. In the image sensor, an image signal having a linear characteristic is outputted in a low luminance range, and an image signal having a logarithmic characteristic is outputted in a high luminance range. Hereinafter, an image sensor having a linear characteristic and a logarithmic characteristic as photoelectric conversion characteristics is called a "linear-logarithmic sensor".

Generally, in a so-called silver halide camera i.e. a film camera, ISO sensitivity correction is performed as one of various correcting operations to be performed with respect to a photographic image. In the case where sensitivity correction is performed in a digital camera, for instance, imaging sensitivity is increased, multiplication is performed with respect to an image signal having a linear characteristic, and summation is performed with respect to an image signal having a logarithmic characteristic (see e.g. Japanese Unexamined Patent Publication No. 2006-352804 (D1)). In the conventional art, as sensitivity is increased in an analog signal status, the dynamic range may be changed.

SUMMARY OF THE INVENTION

In view of the above problems residing in the conventional art, it is an object of the present invention to provide an image sensing apparatus and an image sensing method that enable to perform imaging sensitivity control i.e. sensitivity correction without changing the dynamic range.

An image sensing apparatus and an image sensing method according to an aspect of the invention is configured in such a manner that an image sensor having two or more different photoelectric conversion characteristics is used, a gain of image signals having the respective photoelectric conversion characteristics acquired by the image sensor is calculated based on the image signals having the respective photoelectric conversion characteristics, and gain control is performed with respect to each of the photoelectric conversion characteristics, using the calculated gain. This arrangement enables to control the imaging sensitivity without changing the dynamic range.

These and other objects, features and advantages of the present invention will become more apparent upon reading the following detailed description along with the accompanying drawings.

DESCRIPTION OF THE PREFERRED EMBODIMENTS OF THE INVENTION

Figure 1:
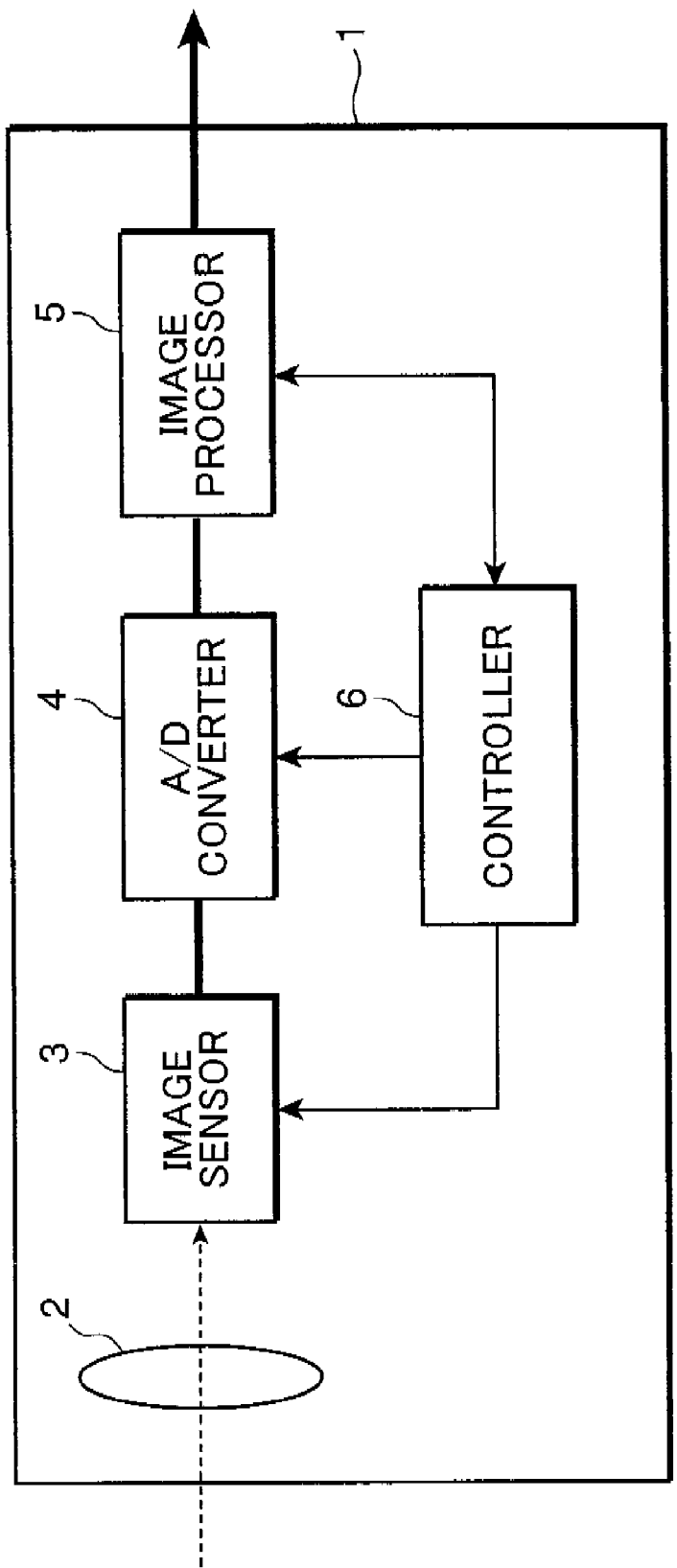
FIG. 1 is a block diagram schematically showing an arrangement primarily on a sensing operation to be performed by a digital camera, as an example of an image sensing apparatus in accordance with a first embodiment of the invention.

In the following, embodiments of the invention are described referring to the drawings. The elements with the same reference numerals throughout the drawings have substantially identical arrangements, and repeated description thereof is omitted herein.

First Embodiment

FIG. 1 is a block diagram schematically showing an arrangement primarily on a sensing operation to be performed by a digital camera, as an example of an image sensing apparatus in accordance with a first embodiment of the invention. Referring to FIG. 1, the digital camera 1 includes a lens unit 2, an image sensor 3, an A/D converter 4, an image processor 5, and a controller 6.

The lens unit 2 constitutes an optical lens system for guiding subject light toward the image sensor 3. The lens unit 2 includes a diaphragm (not shown) and a shutter (not shown) for regulating the transmitted light amount. The controller 6 controls driving of the diaphragm and the shutter.

Figure 2:
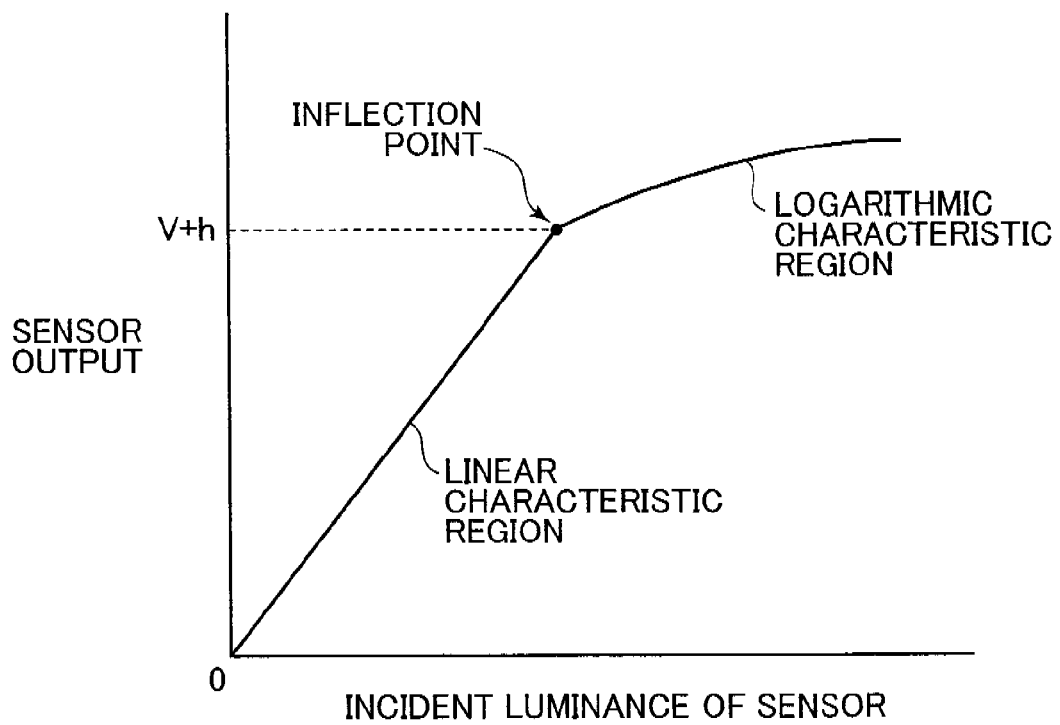
FIG. 2 is a graph showing an example of a photoelectric conversion characteristic of an image sensor incorporated in the digital camera.

The image sensor 3 photoelectrically converts the subject light guided by the lens unit 2 into image signals of respective components of R (red), G (green), and B (blue) in accordance with the amount of subject light, and outputs the image signals of R, G, and B. In this embodiment, as shown in FIG. 2, the image sensor 3 is a solid-state image sensor having a photoelectric conversion characteristic comprised of a linear characteristic region where the light amount is linearly converted into an electric signal by photoelectric conversion, when an illuminance on a light receiving surface of the image sensor 3 i.e. an incident luminance of the image sensor 3 is low i.e. a dark image is captured, and a logarithmic characteristic region where the light amount is logarithmically converted i.e. logarithmically compressed into an electric signal by photoelectric conversion, when the illuminance on the light receiving surface of the image sensor 3 is high i.e. a bright image is captured. In other words, the image sensor 3 is a logarithmic conversion solid-state image sensor having photoelectric conversion characteristics comprised of a linear characteristic in a low luminance range, and a logarithmic characteristic in a high luminance range. The image sensor 3 is configured in such a manner that a switching point i.e. an inflection point between the linear characteristic and the logarithmic characteristic as the photoelectric conversion characteristics is flexibly controllable based on a predetermined control signal to be outputted to the respective pixel circuits in the image sensor 3.

The image sensor 3 is for instance an MOS solid-state image sensor provided with a multitude of pixels in a matrix pattern. Each of the pixels includes therein e.g. a photoelectric conversion element such as a photodiode, a P-type (or N-type) MOSFET (Metal Oxide Semiconductor Field Effect Transistor), and an FD (Floating Diffusion). The image sensor 3 is e.g. an X-Y address type CMOS image sensor. In the image sensor 3 having the above arrangement, a pixel signal having a linear characteristic i.e. a linear characteristic output, and a pixel signal having a logarithmic characteristic i.e. a logarithmic characteristic output are outputted from the FD by e.g. changing a transfer gate potential of a transfer transistor or a reset gate potential of a reset transistor in the MOSFET. Alternatively, the image sensor 3 may be a VMIS image sensor, a CCD image sensor, or a like sensor, in place of the solid-state image sensor.

Figure 3:
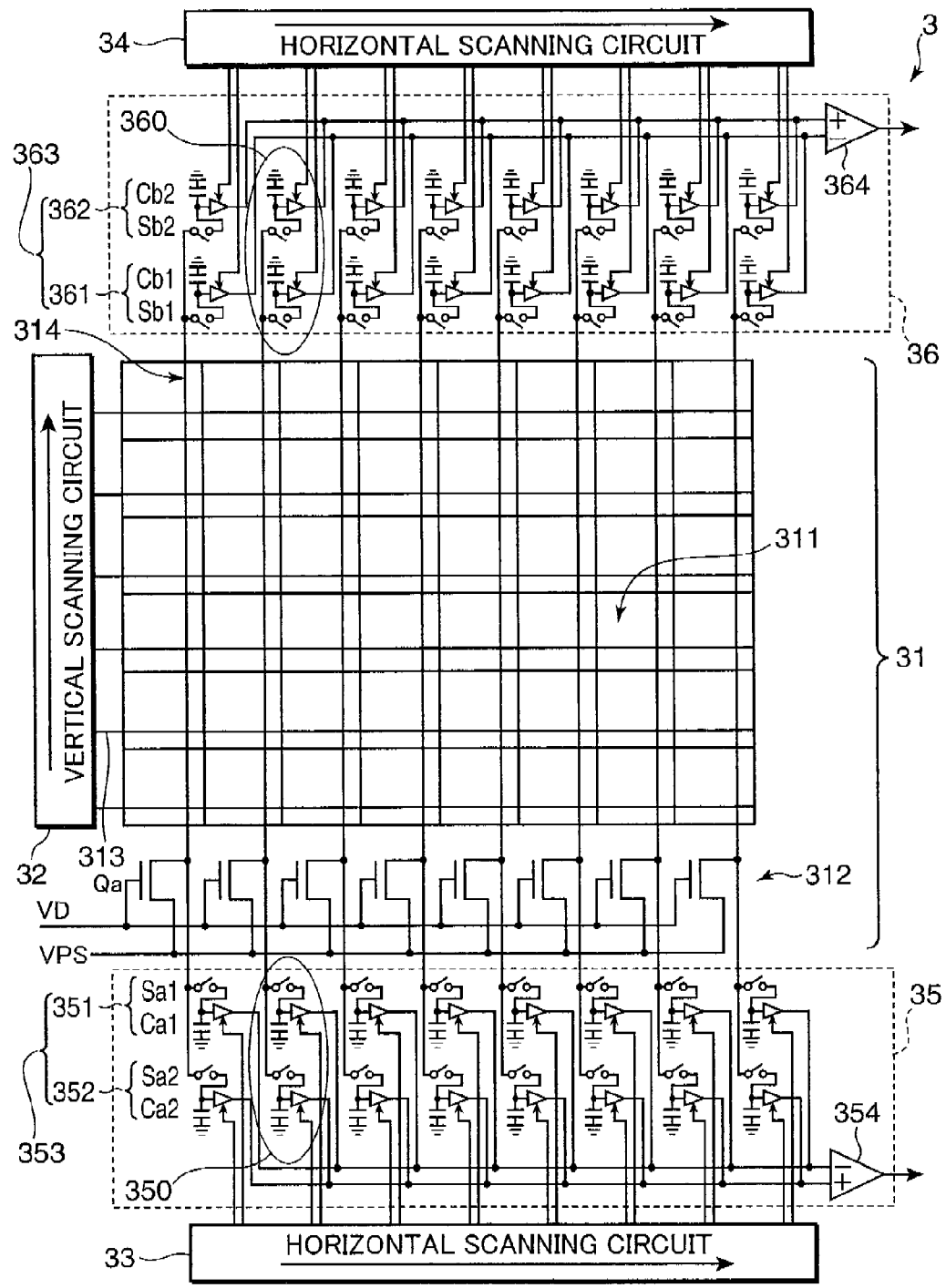
FIG. 3 is a diagram showing an example of a circuit configuration of the image sensor.

Specifically, the image sensor 3 has a circuit configuration as shown in FIG. 3, for instance. Referring to FIG. 3, the image sensor 3 includes a pixel section 31, a vertical scanning circuit 32, a first horizontal scanning circuit 33, a second horizontal scanning circuit 34, a first readout circuit 35, and a second readout circuit 36. The pixel section 31 has a multitude of pixels 311, and photoelectrically converts a subject image into image signals having a linear characteristic and a logarithmic characteristic in accordance with the light amount of the subject image for outputting the image signals. The pixel section 31 has a load circuit 312 equipped with a number of load transistors Qa. Each of the load transistors Qa serves as an electron load to be operable in response to application of a load voltage i.e. a signal VD to a gate thereof.

The vertical scanning circuit 32 is a vertical shift register for performing vertical scanning with respect to the pixels 311 in the pixel section 31, and sequentially scans row selection signal lines 313 row by row. In other words, the vertical scanning circuit 32 performs vertical scanning with respect to all the pixel rows in the pixel section 31. The first horizontal scanning circuit 33 and the second horizontal scanning circuit 34 each is a horizontal shift register for performing horizontal scanning with respect to the pixels 311, and sequentially scans vertical signal lines i.e. column selection signal lines or output signal lines 314 column by column. The first horizontal scanning circuit 33 and the second horizontal scanning circuit 34 each performs column selection with respect to the pixels 311 in the pixel section 31. The first horizontal scanning circuit 33 performs horizontal scanning with respect to a linear characteristic output to be outputted from each of the pixels 311, and the second horizontal scanning circuit 34 performs horizontal scanning with respect to a logarithmic characteristic output i.e. a logarithmic compression characteristic output to be outputted from each of the pixels 311.

The first readout circuit 35 is a circuit for sequentially reading out image signals by the linear characteristic output, which are extracted from the pixels 311 of each pixel row scanned by the vertical scanning circuit 32 to the vertical signal lines 314 in accordance with horizontal scanning by the first horizontal circuit 33, pixel by pixel. Similarly to the first readout circuit 35, the second readout circuit 36 is a circuit for sequentially reading out image signals by the logarithmic characteristic output, which are extracted to the vertical signal lines 314 in accordance with horizontal scanning by the second horizontal scanning circuit 34, pixel by pixel. Thus, in the first embodiment, the image sensor 3 has the readout circuits 35 and 36 individually for the different characteristics as the photoelectric conversion characteristics of the pixels 311. In other words, the image sensor 3 has the first readout circuit 35 and the second readout circuit 36 individually provided for the linear characteristic output and the logarithmic characteristic output. The first readout circuit 35 serves as a sample-and-hold circuit for sampling and holding an image signal and a noise signal by the linear characteristic output; and the second readout circuit 36 serves as a sample-and-hold circuit for sampling and holding an image signal and a noise signal by the logarithmic characteristic output, respectively.

The first readout circuit 35 includes a signal sample-and-hold circuit 351 constituted of a signal sample-and-hold switch Sa1 and a signal sample-and-hold capacity Ca1 corresponding to each output signal line 314; and a noise sample-and-hold circuit 352 constituted of a noise sample-and-hold switch Sa2 and a noise sample-and-hold capacity Ca2 corresponding to each output signal line 314. The signal sample-and-hold circuits 351, and the noise sample-and-hold circuits 352 in the first readout circuit 35 respectively sample an inputted analog image signal, and an inputted noise i.e. an inputted noise signal, and temporarily hold the sampled values. Similarly to the first readout circuit 35, the second readout circuit 36 includes a signal sample-and-hold circuit 361 constituted of a signal sample-and-hold switch Sb1 and a signal sample-and-hold capacity Cb1 corresponding to each output signal line 314; and a noise sample-and-hold circuit 362 constituted of a noise sample-and-hold switch Sb2 and a noise sample-and-hold capacity Cb2 corresponding to each output signal line 314. Similarly to the first readout circuit 35, the signal sample-and-hold circuits 361 and the noise sample-and-hold circuits 362 in the second readout circuit 36 sample-and-hold image signals and noise signals, respectively.

The first readout circuit 35 and the second readout circuit 36 respectively include analog amplifiers 354 and 364 as difference amplifiers. The amplifiers 354 and 364 remove noise components resulting from a sensitivity fluctuation in the pixels 311, and amplify the signals from the pixels 311 in an analog status by an analog gain. Image data i.e. image signals having the linear characteristic and the logarithmic characteristic, which have undergone noise removal and gain adjustment in the amplifiers 354 and 364 respectively, are transmitted to the A/D converter 4, as a processor provided posterior to the image sensor 3. A circuit constituted of a corresponding one of the signal sample-and-hold circuits 351 (361), and a corresponding one of the noise sample-and-hold circuits 352 (362) in each one of the sample-and-hold circuits 353 (363) is referred to as a vertical output circuit 350 (360).

The A/D converter 4 converts an analog image signal amplified by the amplifier 354 (364) in the image sensor 3 into a digital image signal. The image processor 5 performs various image processing operations i.e. digital signal processing operations with respect to image signals having the respective characteristics outputted from the A/D converter 4. The controller 6 includes an ROM for storing control programs or the like, an RAM for temporarily storing data, a CPU (Central Processing Unit) for reading out the control programs or the like for execution, and peripheral circuits thereof. The controller 6 controls overall operations of the digital camera 1. The controller 6 controls a sensing operation of the image sensor 3 or other image processing parameter on the basis of an evaluation result on an image, which is acquired by the image processor 5 based on an image signal.

Figure 4:
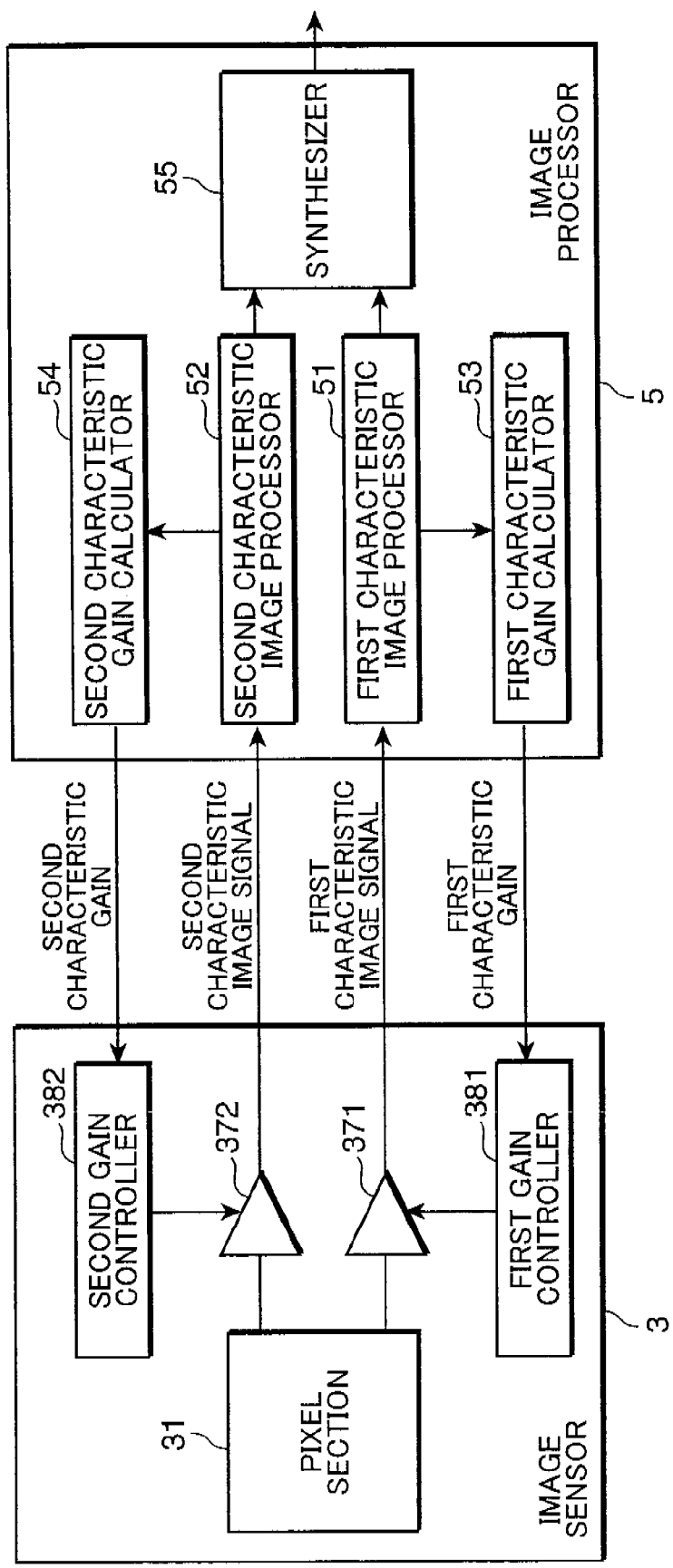
FIG. 4 is a functional block diagram of an example of the image sensor and an image processor in the digital camera.

The digital camera 1 in this embodiment is configured in such a manner that individual image processing operations are performed with respect to image signals having the photoelectric conversion characteristics different from each other, which have been acquired by a sensing operation in accordance with the different photoelectric conversion characteristics. In order to realize the above operation, as shown in FIG. 4, the image sensor 3 includes the pixel section 31, a first amplifier 371 and a second amplifier 372 connected to the pixel section 31, a first gain controller 381 connected to the first amplifier 371 for controlling a gain, and a second gain controller 382 connected to the second amplifier 372 for controlling a gain. The image processor 5 includes a first characteristic image processor 51, a second characteristic image processor 52, a first characteristic gain calculator 53, a second characteristic gain calculator 54, and a synthesizer 55. In this embodiment, two kinds of photoelectric conversion characteristics are provided, wherein one of the two photoelectric conversion characteristics is referred to as a first characteristic, and the other thereof is referred to as a second characteristic.

The first amplifier 371 and the second amplifier 372 respectively amplify a first characteristic image signal having the first characteristic and a second characteristic image signal having the second characteristic to be outputted from the pixel section 31 by multiplying with a predetermined analog gain, and output the amplified image signals to the image processor 5. The amplified image signals are converted into digital signals by the A/D converter 4, which is not shown in FIG. 4. Thereafter, the digital signals are inputted to the image processor 5. The first characteristic image processor 51 and the second characteristic image processor 52 respectively perform image processing operations individually with respect to the first characteristic image signal and the second characteristic image signal. The first characteristic gain calculator 53 calculates a gain for the first characteristic i.e. a first characteristic gain, based on a processing parameter i.e. an estimated value outputted from the first characteristic image processor 51. The calculated first characteristic gain is transmitted to the first gain controller 381 in the image sensor 3, as a control signal. The second characteristic gain calculator 54 calculates a gain for the second characteristic i.e. a second characteristic gain, based on a processing parameter outputted from the second characteristic image processor 52. The calculated second characteristic gain is transmitted to the second gain controller 382 in the image sensor 3, as a control signal. The first gain controller 381 and the second gain controller 382 in the image sensor 3 respectively control amplification operations of the first amplifier 371 and the second amplifier 372, based on information relating to the first characteristic and the second characteristic which has been transmitted from the image processor 5. The synthesizer 55 performs a predetermined synthesis operation with respect to image data having the first characteristic gain and the second characteristic gain, which have undergone various image processing operations by the first characteristic image processor 51 and the second characteristic image processor 52, respectively. A synthesized image obtained by the synthesis operation is outputted to an unillustrated processor provided posterior to the image processor 5.

The image sensor 3 and the image processor 5 are operated in such a manner that: the image sensor 3 outputs analog image signals having the respective characteristics; the image processor 5 performs a predetermined image processing operation and a predetermined synthesis operation with respect to the image signals having the respective characteristics, using a digital signal, calculates the gains for the respective characteristics, and feeds back the gain information to the image sensor 3; and the image sensor 3 amplifies the analog image signals having the respective characteristics based on the gain information. In this way, the image sensor 3 and the image processor 5 are configured so that closed loop control is executable with respect to analog amplification of image signals.

Figure 5:
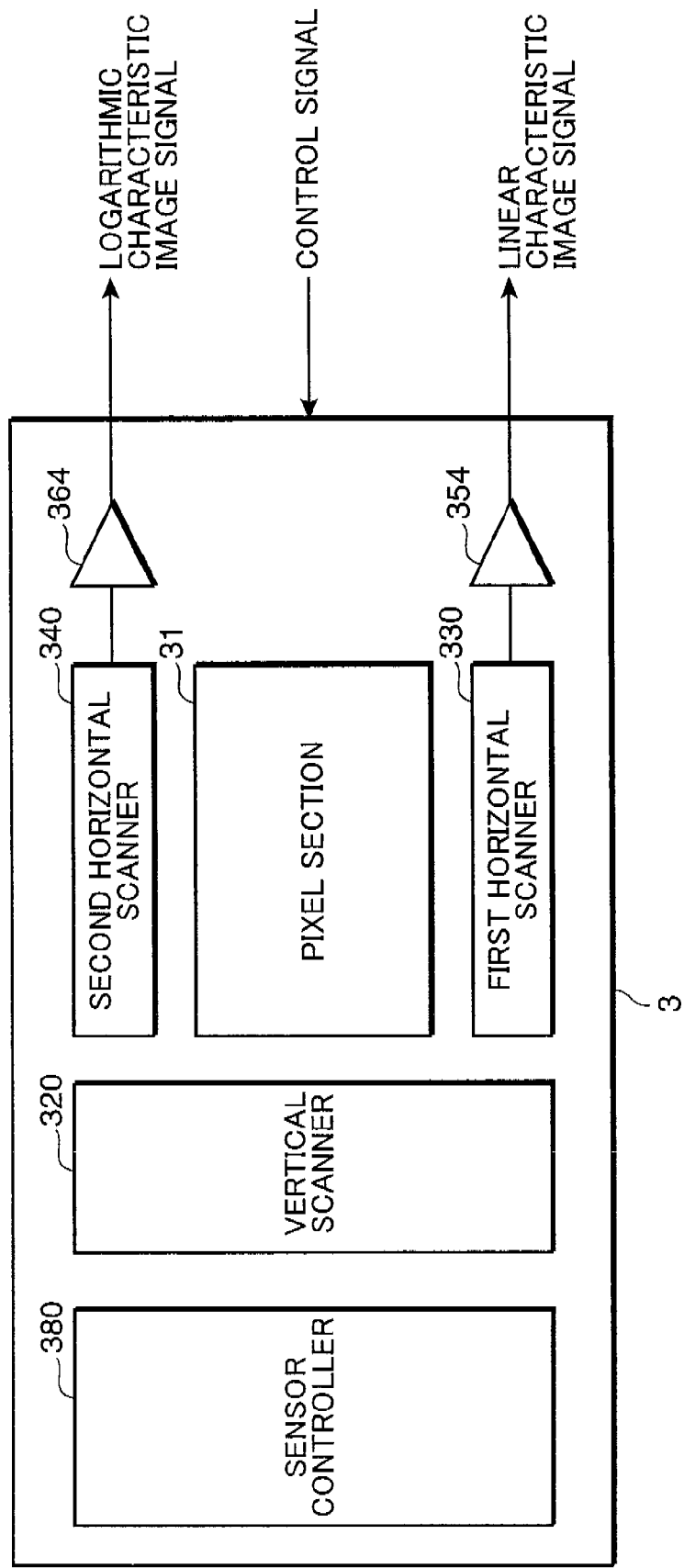
FIG. 5 is a functional block diagram of the image sensor in the case where a linear characteristic and a logarithmic characteristic are provided as different photoelectric conversion characteristics.

In the first embodiment, a sensitivity control operation i.e. a sensitivity correcting operation using image signals having a linear characteristic and a logarithmic characteristic obtained by the image sensor 3 is performed by utilizing the arrangement shown in FIG. 4. In the following, the sensitivity control operation is described in detail. FIG. 5 is a functional block diagram of the image sensor 3 corresponding to the image sensor 3 shown in FIG. 4 in terms of the configuration of the image sensor 3 shown in FIG. 3. The image sensor 3 shown in FIG. 5 includes: the pixel section 31 shown in FIG. 3; a vertical scanner 320 corresponding to the vertical scanning circuit 32 shown in FIG. 3; a first horizontal scanner 330 corresponding to the first horizontal scanning circuit 33 and the first readout circuit 35 shown in FIG. 3 except for the amplifier 354; a second horizontal scanner 340 corresponding to the second horizontal scanning circuit 34 and the second readout circuit 36 shown in FIG. 3 except for the amplifier 364; an amplifier 354; an amplifier 364; and a sensor controller 380 including the first gain controller 381 and the second gain controller 382 shown in FIG. 4.

The image sensor 3 in this embodiment performs an exposure operation in accordance with a linear characteristic and a logarithmic characteristic with respect to each of pixel rows i.e. each of horizontal lines in the pixel section 31, and outputs image signals having the respective characteristics to output circuits i.e. the amplifiers 354 and 364 provided individually for the respective characteristics. The image sensor 3 performs a sensing operation in response to a control signal such as a gain control signal representing a first gain or a second gain, or a timing signal, which is inputted from the image processor 5 or the controller 6 as an external device; and outputs the image signals having the respective characteristics. The vertical scanner 320 outputs, to the first horizontal scanner 330 or the second horizontal scanner 340, the image signals obtained by photoelectric conversion in the pixel section 31 by one horizontal line i.e. pixel signals in a pixel row of the pixels 311 corresponding to one horizontal line, with respect to each of the characteristics for holding in the first horizontal scanner 330 or the second horizontal scanner 340. The image signals having the respective characteristics held in the first horizontal scanner 330 and the second horizontal scanner 340 are amplified by the amplifiers 354 and 364, respectively, pixel by pixel. The amplifier 354 outputs a linear characteristic image signal corresponding to the first characteristic image signal, and the amplifier 364 outputs a logarithmic characteristic image signal corresponding to the second characteristic image signal. The gains to be used by the amplifiers 354 and 364 are respectively set by the sensor controller 380, based on a control signal inputted from the external device. Also, the sensor controller 380 controls amplification operations of the amplifiers 354 and 364 in response to a control signal inputted from the external device, and controls a photoelectric conversion operation of the pixel section 31, a vertical scanning operation of the vertical scanner 320, and horizontal scanning operations of the first horizontal scanner 330 and the second horizontal scanner 340.

Figure 6:
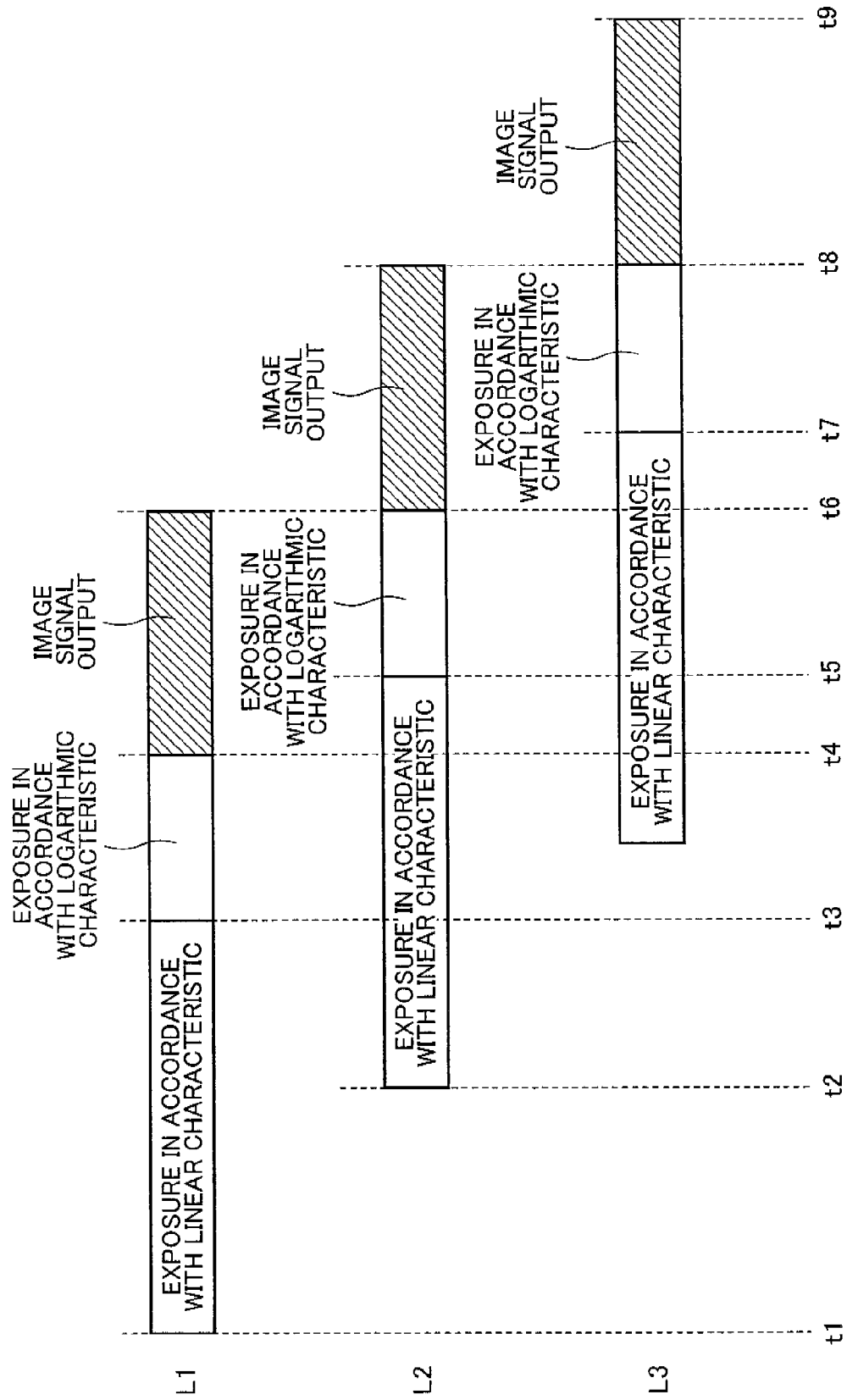
FIG. 6 is a timing chart for describing the timing of an exposure operation in accordance with a linear characteristic and a logarithmic characteristic, and an image signal output operation.

In this embodiment, the timing of an exposure operation in accordance with the respective photoelectric conversion characteristics, and an image signal output operation i.e. a readout operation with respect to each of the horizontal lines is described referring to FIG. 6. In this embodiment, an exposure operation and a readout operation with respect to three horizontal lines are described. First, an exposure operation is performed in accordance with a linear characteristic with respect to one horizontal line L1 for a predetermined exposure period from the point of time t1 to the point of time t3. When the exposure operation in accordance with the linear characteristic is ended, image signals acquired by the exposure operation are outputted to the first horizontal scanner 330 for holding. Then, an exposure operation in accordance with a logarithmic characteristic is performed for a predetermined exposure period from the point of time t3 to the point of time t4. When the exposure operation in accordance with the logarithmic characteristic is ended, image signals acquired by the exposure operation are outputted to the second horizontal scanner 340 for holding. Thereafter, the image signals having the respective characteristics are read out from the first horizontal scanner 330 and the second horizontal scanner 340, respectively. In other words, the image signals are amplified with respective predetermined gains by the amplifiers 354 and 364, and the amplified image signals having the respec- tive characteristics are outputted. The above image signal output operation is performed for a period from the point of time t4 to the point of time t6. Similarly to the horizontal line L1, exposure and readout control is performed with respect to a horizontal line L2 following the horizontal line L1, and a horizontal line L3 following the horizontal line L2. Thus, image signals concerning the horizontal lines L2 and L3 are sequentially outputted, following the output of the image signals concerning the horizontal line L1. In other words, following the image signal output period concerning the horizontal line L1 from the point of time t4 to the point of time t6, the image signals concerning the horizontal line L2 are sequentially outputted for the image signal output period concerning the horizontal line L2 from the point of time t6 to the point of time t8, and then, the image signals concerning the horizontal line L3 are sequentially outputted for the image signal output period concerning the horizontal line L3 from the point of time t8 to the point of time t9. In this way, an exposure operation in accordance with a linear characteristic, an exposure operation in accordance with a logarithmic characteristic, and an image signal output operation are sequentially performed line after line with respect to all the horizontal lines i.e. all the pixel rows in the pixel section 31.

Figure 7:
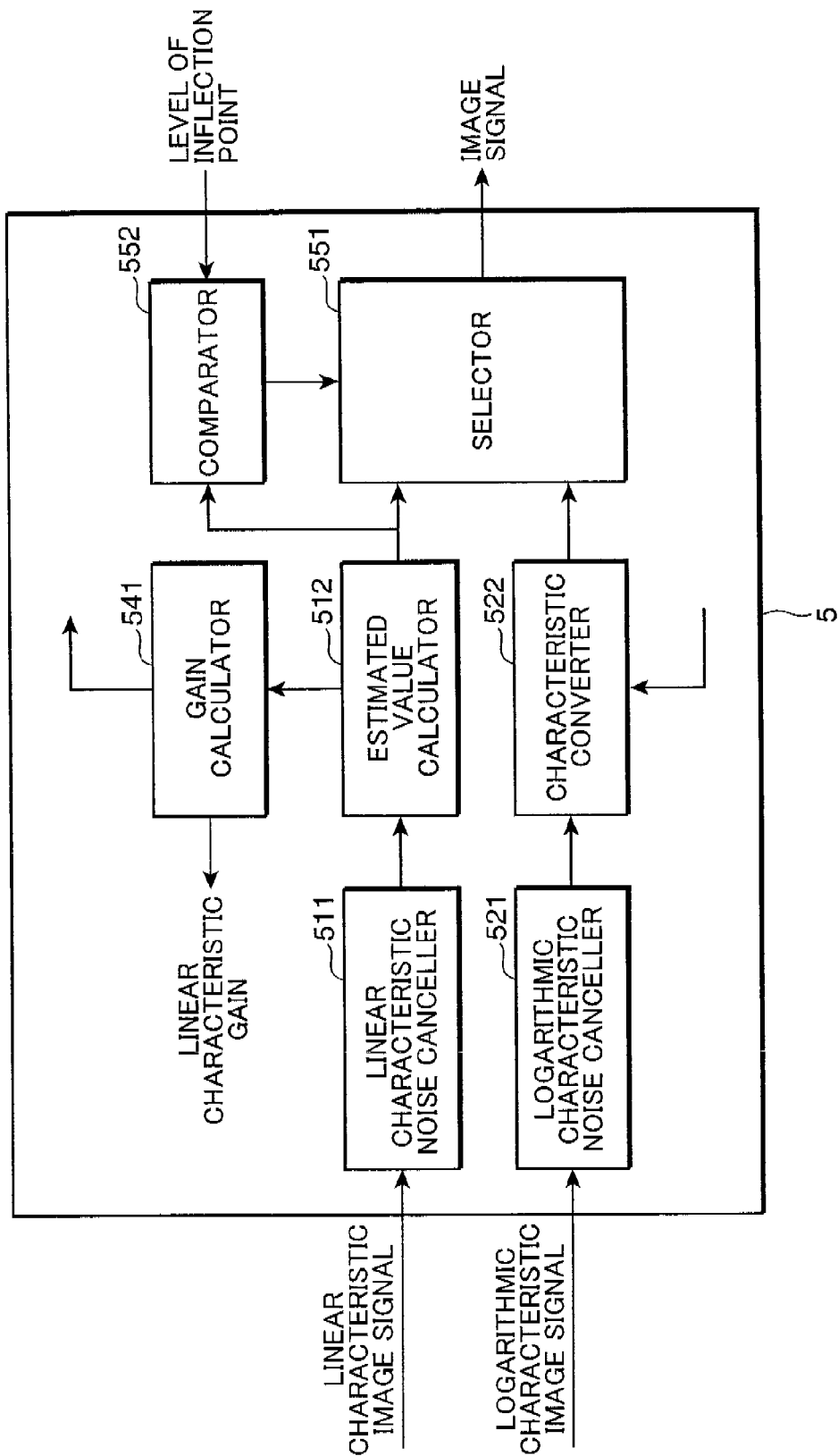
FIG. 7 is a functional block diagram of the image processor in the case where a linear characteristic and a logarithmic characteristic are provided as different photoelectric conversion characteristics.

FIG. 7 is a functional block diagram primarily on a sensitivity control operation to be performed by the image processor 5, in the case where the sensitivity control operation i.e. a sensitivity correcting operation using image signals having the respective characteristics is performed by utilizing the arrangement shown in FIG. 4, similarly to the arrangement of the image sensor 3 shown in FIG. 5. As shown in FIG. 7, the image processor 5 includes a linear characteristic noise canceller 511, an estimated value calculator 512, a logarithmic characteristic noise canceller 521, a characteristic converter 522, a gain calculator 541, a selector 551, and a comparator 552. The linear characteristic noise canceller 511 and the estimated value calculator 512 correspond to the first characteristic image processor 51 in the image processor 5 shown in FIG. 4. The gain calculator 541 corresponds to the first characteristic gain calculator 53 shown in FIG. 4. The logarithmic characteristic noise canceller 521 and the characteristic converter 522 correspond to the second characteristic image processor 52 shown in FIG. 4. The selector 551 and the comparator 552 correspond to the synthesizer 55 shown in FIG. 4.

The linear characteristic noise canceller 511 removes a fixed pattern noise of a linear characteristic image signal which has been converted into a digital signal by the A/D converter 4, in other words, removes a fixed pattern noise (FPN) inherent to a sensing operation in accordance with a linear characteristic. The fixed pattern noise corresponds to a fluctuation in dark current, i.e. an offset variation with respect to each of the pixels in the pixel section 311.

The estimated value calculator 512 calculates a predetermined estimated value, based on the entirety of a linear characteristic image signal whose fixed pattern noise is removed by the linear characteristic noise canceller 511 i.e. linear characteristic data corresponding to one frame of a sensed image. In this embodiment, an average value with respect to the entirety of the linear characteristic data is calculated as an estimated value. The calculated estimated value is outputted to the gain calculator 541. The estimated value may be various values such as an average value, a maximum value and a minimum value with respect to a main subject image area, a weighted average value based on a spatial arrangement of pixel, and a pixel value variance based on a histogram or the like, in addition to the average value obtained by summation averaging with respect to the entirety of a monitor image.

The gain calculator 541 calculates a gain of a linear characteristic image signal i.e. a linear characteristic gain, based on the estimated value inputted from the estimated value calculator 512. The linear characteristic gain is calculated by comparing the estimated value with a reference estimated value, i.e. by performing division. The reference estimated value is pre-stored in the gain calculator 541.

It is possible to set the gain of a linear characteristic image signal and the gain of a logarithmic characteristic image signal in the image sensing apparatus of this embodiment to a different value from each other (see FIG. 4). In particular, in the sensitivity control operation to be performed in this embodiment, the gain of a linear characteristic image signal is variable based on the estimated value obtained from the linear characteristic image signal. In other words, since the gain is calculated merely with respect to the linear characteristic image signal, a gain calculator corresponding to the second characteristic gain calculator 54 shown in FIG. 4 is not illustrated in FIG. 7. Alternatively, the estimated value may be a weighted average value based on a space arrangement of pixel, or a pixel value variance based on a histogram or the like, in place of the average value with respect to the entirety of a monitor image corresponding to a frame image.

The logarithmic characteristic noise canceller 521 removes a fixed pattern noise (FPN) in a logarithmic characteristic image signal which has been converted into a digital signal by the A/D converter 4. The fixed pattern noise in this operation corresponds to a variation in threshold value Vth from which a logarithmic characteristic is started. The threshold value Vth is different among pixel signals outputted from the individual pixels 311.

The characteristic converter 522 converts the characteristic of the logarithmic characteristic image signal i.e. logarithmic characteristic data, whose fixed pattern noise is removed by the logarithmic characteristic noise canceller 521, into a linear characteristic. The characteristic conversion is performed by using an LUT (Lookup Table) pre-stored in the characteristic converter 522. The lookup table is changed depending on the gain of a linear characteristic image signal i.e. the linear characteristic gain calculated by the gain calculator 541. In other words, the image sensor 3 changes the lookup table based on the linear characteristic image signal which has undergone amplification by using the linear characteristic gain. In this arrangement, for instance, information on various lookup tables corresponding to the linear characteristic gains may be stored in the characteristic converter 522 so that one of the lookup tables is selected depending on the value of the linear characteristic gain given from the gain calculator 541. In this embodiment, an amplification operation i.e. gain control is not performed with respect to a logarithmic characteristic image signal. This is conceivably equivalent to a control that the amplifier 364 (see FIG. 5) or the second amplifier 372 performs an amplification operation with the gain "1". In this arrangement, for instance, the characteristic converter 522 sends, to the amplifier 364 or the second amplifier 372, a gain control signal on a logarithmic characteristic gain indicating that the gain is "1".

The selector 551 selects an image signal in accordance with the signal level of the linear characteristic image signal, out of the linear characteristic image signal outputted from the estimated value calculator 512, and the linear characteristic image signal outputted from the characteristic converter 522 after characteristic conversion. The selector 551 selectively synthesizes the linear characteristic image data and the logarithmic characteristic image data. The selected image signals are outputted to an unillustrated processor provided posterior to the selector 551. The comparator 552 compares, for instance, the level of a predetermined inflection point given from the controller 6, with a linear characteristic image signal outputted from the estimated value calculator 512 i.e. a gradient on a graph to be described later or an estimated value; and outputs the information on the inflection point position obtained by the comparison result to the selector 551. The inflection point position is a coordinate position to be defined based on the level of the inflection point and an illuminance at the inflection point, as will be described later. The level of the inflection point shown in FIG. 8 may be any level, as far as the level of the inflection point is equal to or lower than the saturation level of the linear characteristic image signal and the logarithmic characteristic image signal i.e. the image sensor output. The same idea is applied to the arrangements shown in FIGS. 14 and 15.

In the above arrangement, the gains of the image signals to be used by the digital camera 1 of this embodiment are controlled in such a manner that the gain of a linear characteristic image signal and the gain of a logarithmic characteristic image signal are set at a different value from each other, specifically that the gain of a linear characteristic image signal is controllable based on the estimated value obtained merely from the linear characteristic image signal.

Figure 8:
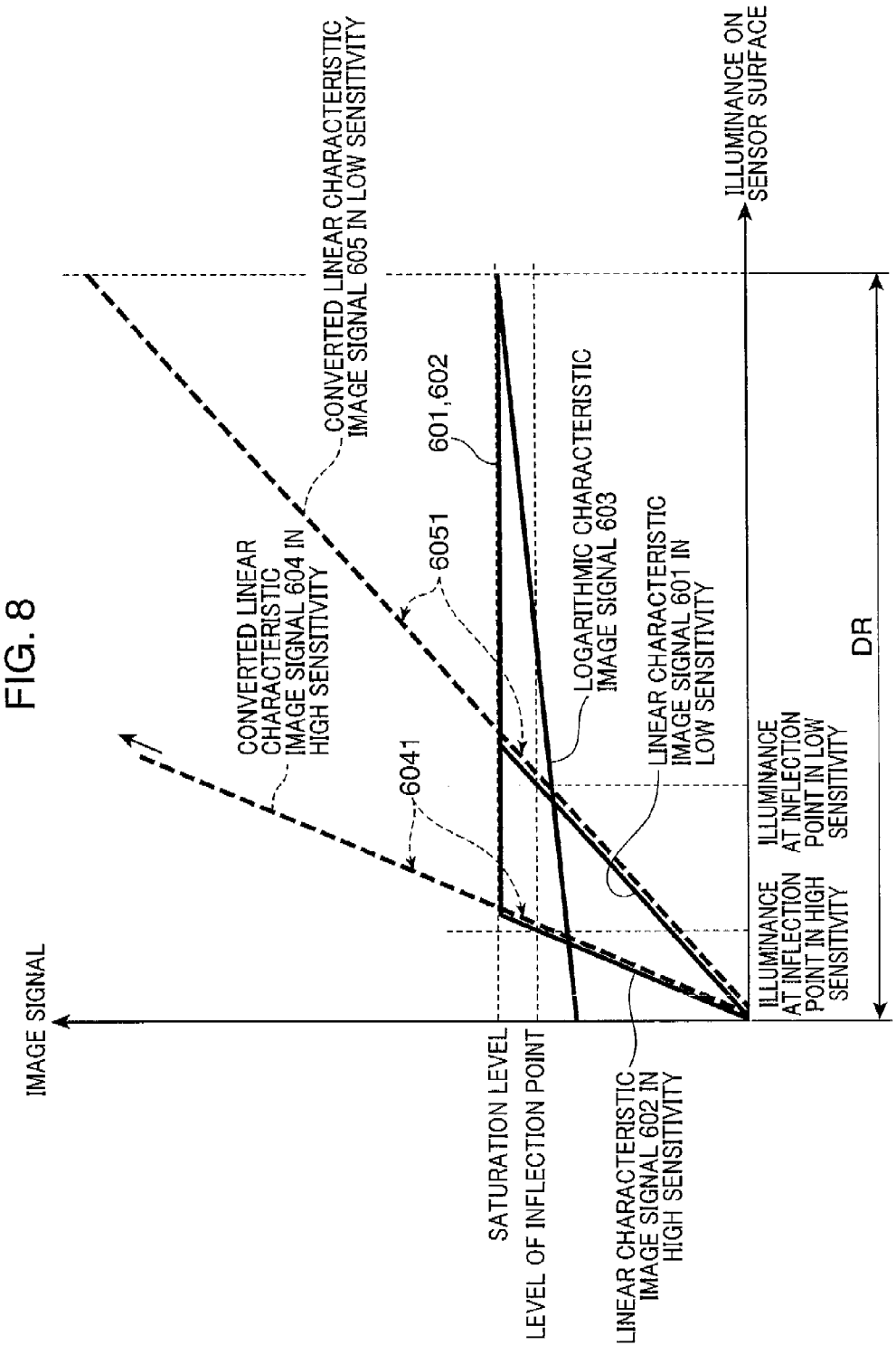
FIG. 8 is a graph for describing a selecting operation to be performed by a selector in the image processor shown in FIG. 7 with respect to image signals having different photoelectric conversion characteristics.

FIG. 8 is a graph for describing a selecting operation to be performed by the selector 551. Referring to FIG. 8, an image signal 601 in a range from the point of origin to a saturation level of the image signal in FIG. 8 is a linear characteristic image signal which is amplified by the amplifier 354 in the image sensor 3, using a linear characteristic gain calculated by the gain calculator 541, and transmitted to the selector 551 via the linear characteristic noise canceller 511 and the estimated value calculator 512. On the other hand, an image signal 602 in a range from the point of origin to the saturation level of the image signal in FIG. 8 is a linear characteristic image signal which is amplified by the amplifier 354, using a linear characteristic gain larger than the linear characteristic gain for the linear characteristic image signal 601, and transmitted to the selector 551 via the linear characteristic noise canceller 511 and the estimated value calculator 512. In this arrangement, assuming that the image signal level with respect to the illuminance on the light receiving surface of the image sensor 3, in other words, a degree of output with respect to input on subject luminance, is a sensitivity of the digital camera 1 corresponding to ISO sensitivity, the linear characteristic image signal 601 corresponds to a linear characteristic image signal in the case where the sensitivity of the digital camera 1 is in a low sensitivity range, and the linear characteristic image signal 602 corresponds to a linear characteristic image signal in the case where the sensitivity of the digital camera 1 is in a high sensitivity range, because the linear characteristic gains are different between the linear characteristic image signals 601 and 602. The linear characteristic gain to be used in the case where the sensitivity of the digital camera 1 is in the low sensitivity range is referred to as a "low sensitivity gain", and the linear characteristic gain to be used in the case where the sensitivity of the digital camera 1 is in the high sensitivity range is referred to as a "high sensitivity gain". The saturation level is a level at which the output i.e. the linear characteristic image signal of the image sensor 3 is saturated, and corresponds to e.g. a maximum value of the output level of the image sensor 3. The saturation level is not a saturation level in image processing, but is a saturation level of the image sensor 3. An image signal 603 is a logarithmic characteristic image signal that is outputted from the amplifier 364 in the image sensor 3, and transmitted to the characteristic converter 522 via the logarithmic characteristic noise canceller 521.

Figure 9:
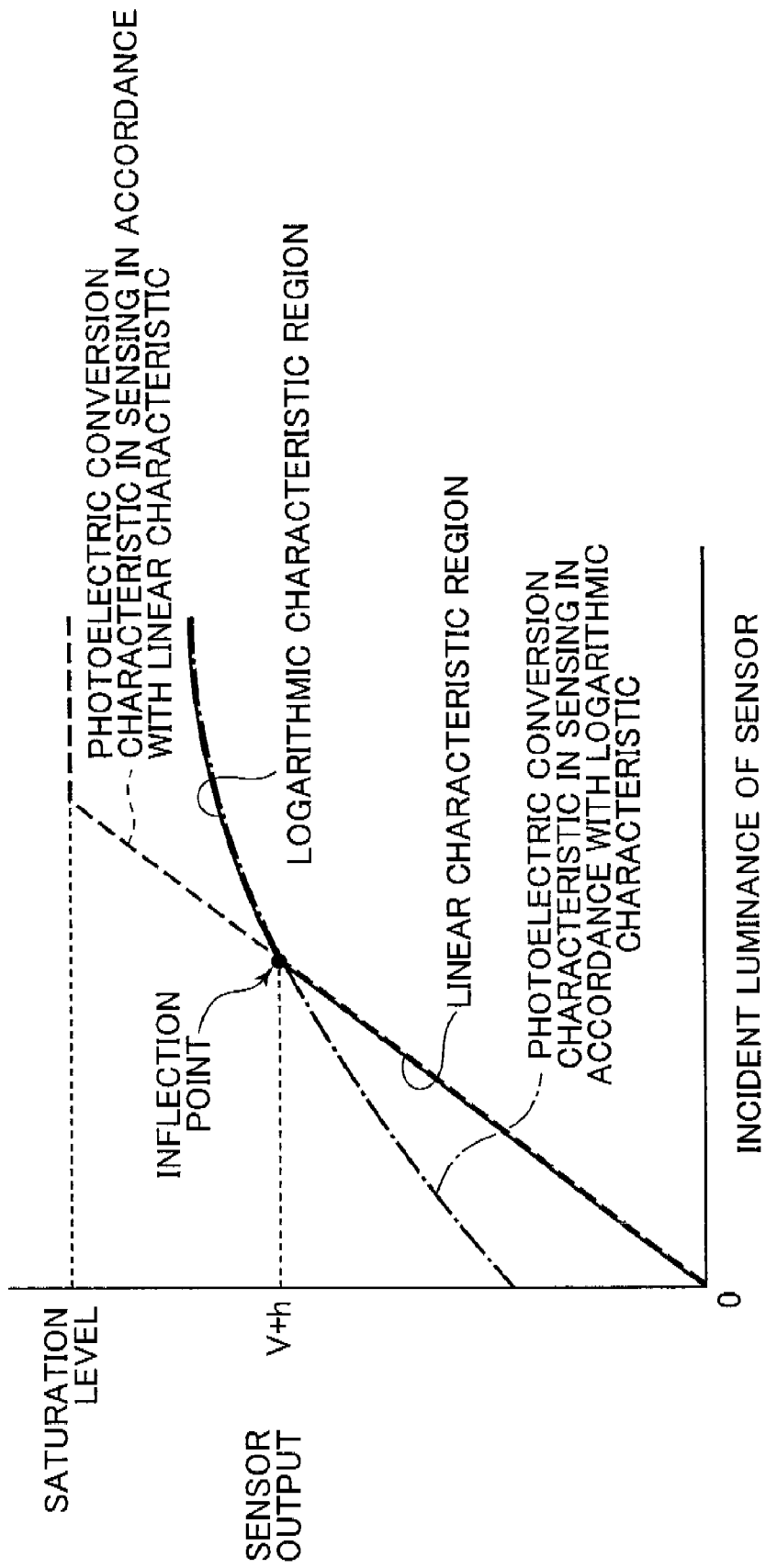
FIG. 9 is a graph for describing the position of inflection point in an exposure operation in accordance with a linear characteristic and a logarithmic characteristic.

The level of the inflection point shown in FIG. 8 is a level i.e. output level information given to the comparator 552, and equals to or lower than the saturation level. As shown in FIG. 9, however, in the case where an exposure operation in accordance with a linear characteristic is performed, the operation of the image sensor 3 is controlled in such a manner that the level of the inflection point is equal to or higher than the saturation level of the sensor output. With this arrangement, all the output signals from the image sensor 3 have a linear characteristic. In the case where an exposure operation in accordance with a logarithmic characteristic is performed, the operation of the image sensor 3 is controlled in such a manner that the level of the inflection point is equal to or lower than the lowest level of the sensor output. With this arrangement, all the output signals from the image sensor 3 have a logarithmic characteristic.

The logarithmic characteristic image signal 603 is subjected to characteristic conversion by the characteristic converter 522 into a linear characteristic image signal in accordance with the magnitude of the linear characteristic gain given from the gain calculator 541 i.e. a linear characteristic having a gradient on the graph depending on the gain. Specifically, a linear characteristic image signal 604 (hereinafter, called as a "converted linear characteristic image signal 604") is obtained by subjecting the logarithmic characteristic image signal 603 to characteristic conversion in accordance with the high sensitivity gain; and a converted linear characteristic image signal 605 is obtained by subjecting the logarithmic characteristic image signal 603 to characteristic conversion in accordance with the low sensitivity gain.

The selector 551 selects an image signal obtained by a sensing operation in accordance with a linear characteristic in the range where the output level of the image signal is equal to or lower than the level of the inflection point; and selects an image signal obtained by a sensing operation in accordance with a logarithmic characteristic in the range where the output level of the image signal is higher than the level of the inflection point. In the case where the sensitivity of the digital camera 1 is in the low sensitivity range, the linear characteristic image signal 601 is selected, as far as the output level of the image signal is equal to or lower than the level of the inflection point; and the converted linear characteristic image signal 605 is selected when the output level of the image signal is higher than the level of the inflection point. In other words, in the case where the sensitivity of the digital camera 1 is in the low sensitivity range, the linear characteristic image signal 601, and an image signal component 6051 in the converted linear characteristic image signal 605 corresponding to a range from the level of the inflection point to the maximum value of the dynamic range are selected, while using the level of the inflection point i.e. an illuminance at the inflection point in the case where the sensitivity of the digital camera 1 is in the low sensitivity range, as a switching point. Similarly, in the case where the sensitivity of the digital camera 1 is in the high sensitivity range, the linear characteristic image signal 602 and the converted linear characteristic image signal 604 are selected. In other words, in the case where the sensitivity of the digital camera 1 is in the high sensitivity range, the linear characteristic image signal 602, and an image signal component 6041 in the converted linear characteristic image signal 604 corresponding to a range from the level of the inflection point to the maximum value of the dynamic range are selected, while using the level of the inflection point i.e. an illuminance at the inflection point in the case where the sensitivity of the digital camera 1 is in the high sensitivity range, as a switching point. Then, the selector 551 synthesizes the selected image signal components having the respective characteristics, and outputs the synthesis result as a single image. The illuminance at the inflection point as a switching point between the linear characteristic and the logarithmic characteristic concerning a sensing illuminance, differs depending on the gain of the linear characteristic image signal. In the case where the sensitivity of the digital camera 1 is in the high sensitivity range i.e. a large gain is used, the photoelectric conversion characteristic is turned into a logarithmic characteristic from a linear characteristic due to a lower illuminance, as compared with the case where the sensitivity of the digital camera 1 is in the low sensitivity range i.e. a small gain is used.

In the above arrangement, the gain of the linear characteristic as the photoelectric conversion characteristic with which at least an image in a low luminance range is sensed, is calculated by using the estimated value obtained merely from the image signal having the photoelectric conversion characteristic in the low luminance range. Then, an amplification operation is performed merely with respect to an image signal representing an image of a lowest luminance after image generation. In other words, for instance, an amplification operation is performed merely with respect to an image signal having a photoelectric conversion characteristic in the low luminance range. The amplified linear characteristic image signal, and an image signal having a photoelectric conversion characteristic which has not undergone amplification i.e. a logarithmic characteristic image signal are synthesized by the selector 551 in the aforementioned manner. Thereby, the imaging sensitivity can be controlled, in other words, the sensitivity can be increased without changing the dynamic range. Also, since an amplification operation is performed by the image sensor 3 provided anterior to the A/D converter 4, it is possible to perform an amplification operation with respect to an analog image signal excluding noise, which may be generated in the A/D converter 4. This enables to increase the S/N ratio. Thus, the imaging sensitivity control can be performed while maintaining a wide dynamic range in a high S/N ratio condition. Amplification is performed with respect to an image signal having a linear characteristic as the photoelectric conversion characteristic in the low luminance range to enhance the quality i.e. increase the gradation of a dark image portion i.e. an image portion having a low luminance in an image obtained by the image generation.

Second Embodiment

Figure 10:
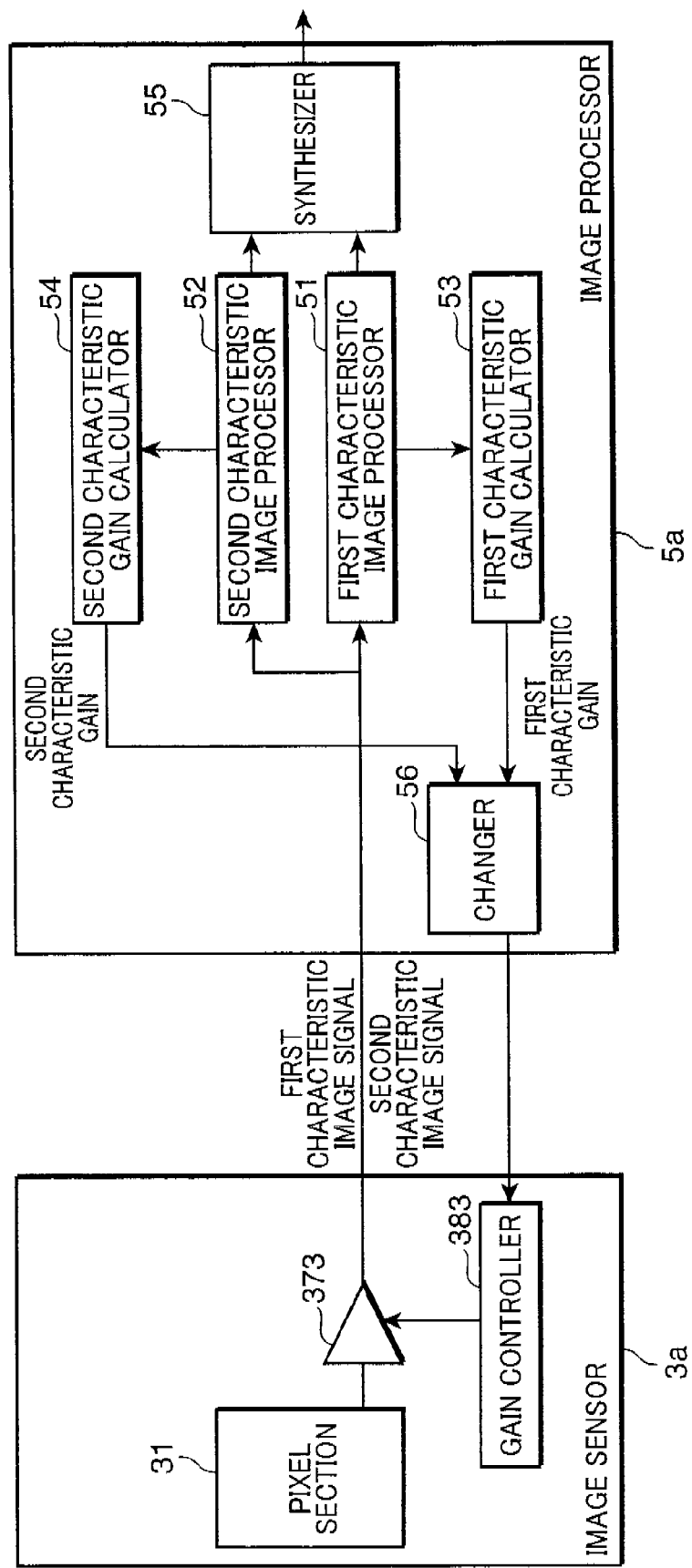
FIG. 10 is a functional block diagram of an example of an image sensor and an image processor in a digital camera in accordance with a second embodiment of the invention.

In the first embodiment, individual image processing operations for the image signals having the respective characteristics are performed by using the arrangement of the image sensor 3 and the image processor 5 shown in FIG. 4. In the second embodiment, an image processing operation is performed by utilizing an arrangement of an image sensor 3a and an image processor 5a shown in FIG. 10. In the arrangement of FIG. 4, the first characteristic image signal and the second characteristic image signal are respectively individually outputted from the first amplifier 371 and the second amplifier 372. In the arrangement of FIG. 10, a first characteristic image signal and a second characteristic image signal are outputted from a single amplifier 373 at a different timing from each other. In order to realize the above operation, the image sensor 3a in the second embodiment includes a gain controller 383, in place of the first gain controller 381 and the second gain controller 382 shown in FIG. 4, and the amplifier 373 in place of the first amplifier 371 and the second amplifier 372. The image processor 5a further includes a changer 56.

The amplifier 373 amplifies the first characteristic image signal and the second characteristic image signal outputted from a pixel section 31 with a predetermined analog gain, and outputs the amplified image signals to the image processor 5a. The image processor 5a receives the amplified first and second characteristic image signals. Upon receiving the amplified first and second characteristic image signals, a first characteristic image processor 51 and a second characteristic image processor 52 perform image processing operations with respect to each of the characteristics. A synthesizer 55 performs a predetermined synthesis operation by using the image processing result. Then, a first characteristic gain calculator 53 and a second characteristic gain calculator 54 respectively calculate a first characteristic gain and a second characteristic gain by using a processing parameter i.e. an estimated value in image processing. The above operations are substantially the same as those in the image processor 5. Information relating to the calculated first and second characteristic gains is outputted to the changer 56. The changer 56 changes over between a signal indicating the first characteristic gain and a signal indicating the second characteristic gain, and transmits the corresponding signal to the gain controller 383 at a different timing from each other. The gain controller 383 controls an amplification operation with respect to the first characteristic image signal based on the transmitted information relating to the first characteristic gain, and controls an amplification operation with respect to the second characteristic image signal based on the transmitted information relating to the second characteristic gain.

Figure 11:
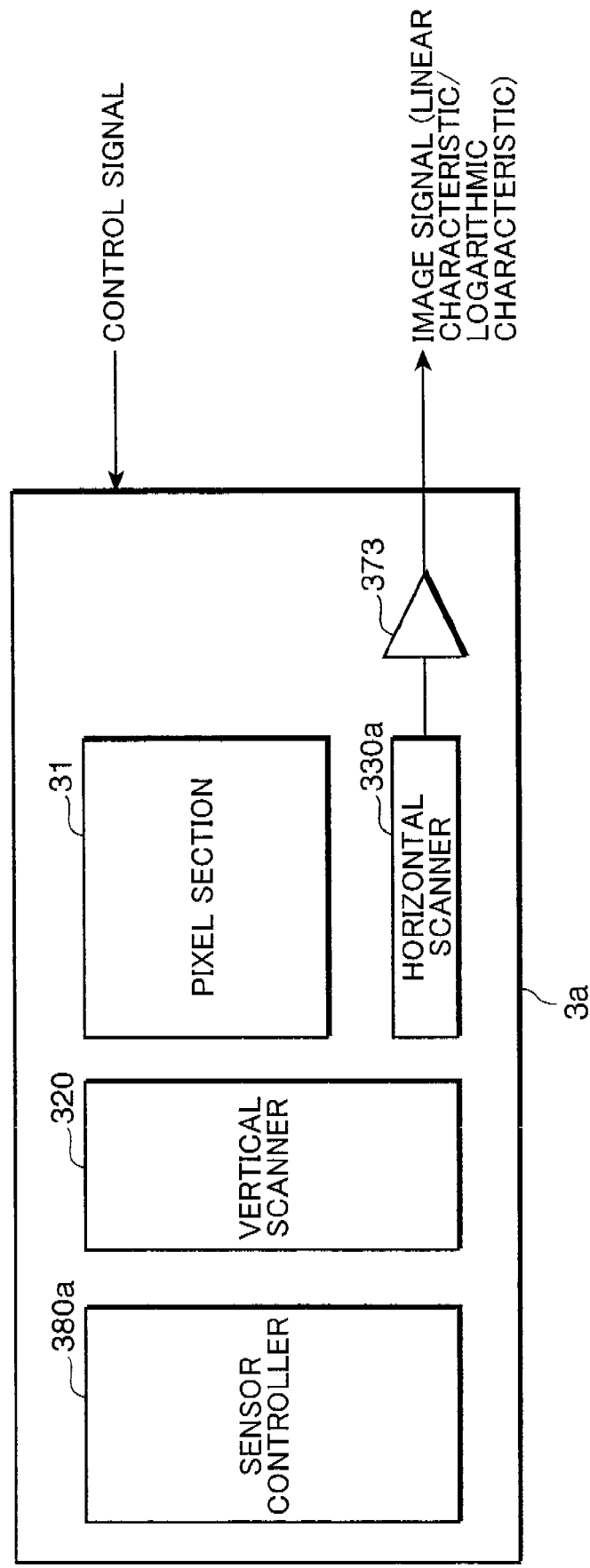
FIG. 11 is a functional block diagram of the image sensor shown in FIG. 10 in the case where a linear characteristic and a logarithmic characteristic are provided as different photoelectric conversion characteristics.

In this embodiment, a sensitivity control operation i.e. a sensitivity correcting operation using an image signal having a linear characteristic and an image signal having a logarithmic characteristic is performed by using the arrangement shown in FIG. 10. FIG. 11 shows an arrangement of the second embodiment corresponding to the arrangement of the first embodiment shown in FIG. 5. Unlike the image sensor 3 shown in FIG. 5, the image sensor 3a includes a sensor controller 380a, a horizontal scanner 330a, and the amplifier 373. The sensor controller 380a is a controller including the gain controller 383 shown in FIG. 10. The horizontal scanner 330a reads out image signals having a linear characteristic and a logarithmic characteristic from the pixel section 31. The image sensor 3a performs an exposure operation in accordance with a linear characteristic and an exposure operation in accordance with a logarithmic characteristic frame by frame, and outputs the image signals having the respective characteristics to a common output terminal i.e. the amplifier 373. In this arrangement, an exposure operation on one frame image is performed in accordance with a linear characteristic, and an exposure operation on one frame image is performed in accordance with a logarithmic characteristic, in other words, exposure operations on two frame images are performed, and image signals acquired by the exposure operations are outputted. A vertical scanner 320 outputs, to the horizontal scanner 330a, the image signals obtained by photoelectric conversion in the pixel section 31 by one horizontal line i.e. pixel signals in a pixel row of pixels 311 corresponding to one horizontal line, with respect to each of the characteristics for holding in the horizontal scanner 330a. The image signals having the respective characteristics held in the horizontal scanner 330a are amplified by the amplifier 373 pixel by pixel, and the amplified image signals are outputted. The gain of the amplifier 373 is variable with respect to each of the frames. The gain of the amplifier 373 is set by the sensor controller 380a, based on a control signal inputted from an external device. The sensor controller 380a controls an amplification operation of the amplifier 373 in response to the control signal inputted from the external device, and controls various operations of the pixel section 31, the vertical scanner 320 and the horizontal scanner 330a.

Figure 12:
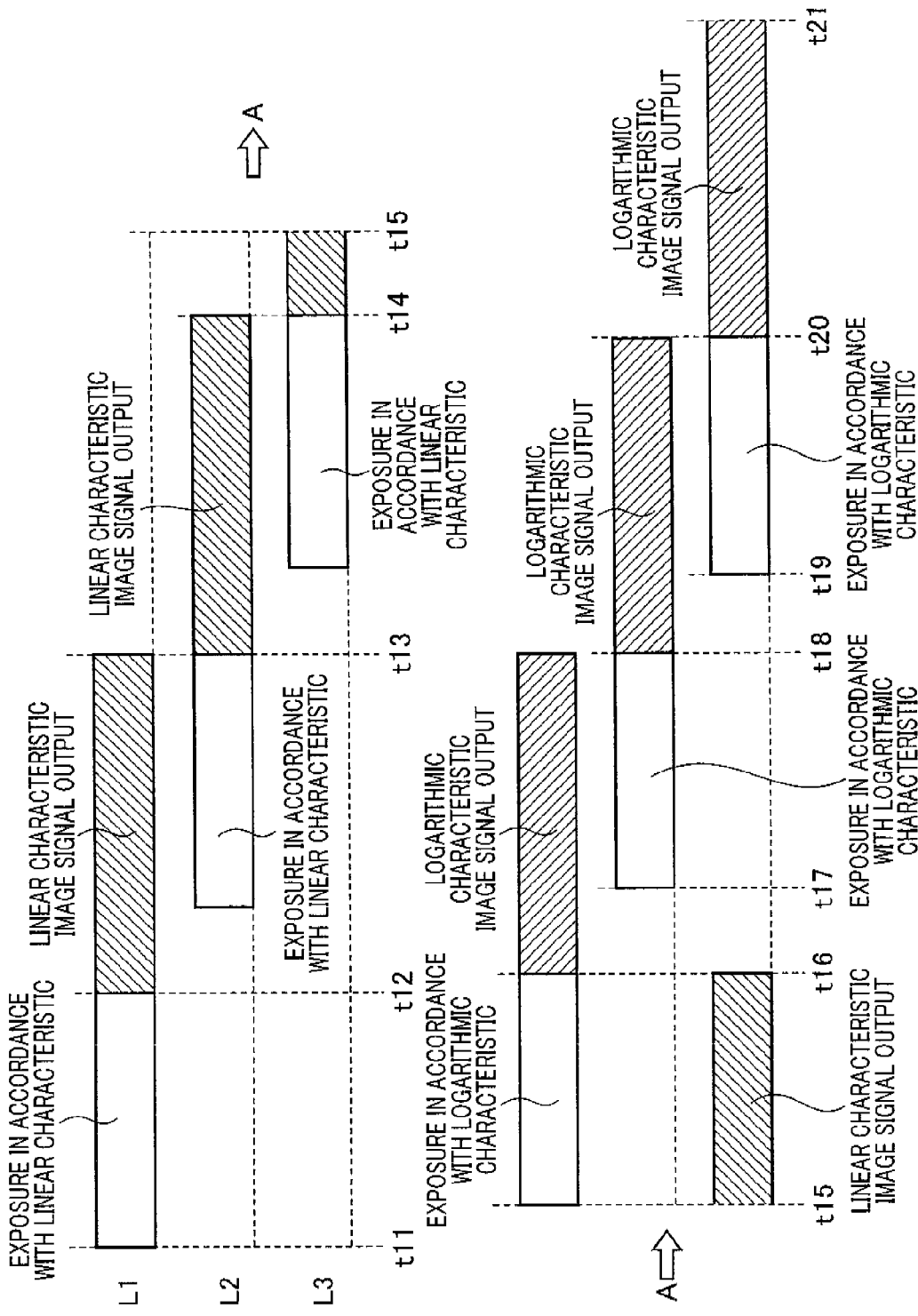
FIG. 12 is a timing chart for describing the timing of an exposure operation in accordance with a linear characteristic and a logarithmic characteristic, and an image signal output operation in the second embodiment.

The timing of an exposure operation in accordance with the respective photoelectric conversion characteristics, and an image signal output operation i.e. a readout operation with respect to each of the horizontal lines in this embodiment is described referring to FIG. 12. In this embodiment, an exposure operation and a readout operation with respect to three horizontal lines are described. First, an exposure operation is performed in accordance with a linear characteristic with respect to one horizontal line L1 for a predetermined exposure period from the point of time t11 to the point of time t12. When the exposure operation in accordance with the linear characteristic is ended, image signals acquired by the exposure operation i.e. linear characteristic image signals are outputted to the horizontal scanner 330a for holding i.e. readout. Then, the linear characteristic image signals concerning the horizontal line L1, which are held in the horizontal scanner 330a, are amplified with a predetermined gain by the amplifier 373, and outputted. The above operation is performed for a period from the point of time t12 to the point of time t13. Similarly to the horizontal line L1, exposure and readout control is performed with respect to horizontal lines L2 and L3. Specifically, following the output of the linear characteristic image signals concerning the horizontal line L1, linear characteristic image signals concerning the horizontal line L2, and linear characteristic image signals concerning the horizontal line L3 are sequentially outputted. In other words, the linear characteristic image signal output operation concerning the horizontal lines L1 through L3 is sequentially executed in such a manner that the linear characteristic image signal output operation concerning the horizontal line L1 is performed for the period from the point of time t12 to the point of time t13; the linear characteristic image signal output operation concerning the horizontal line L2 is performed for the period from the point of time t13 to the point of time t14; and the linear characteristic image signal output operation concerning the horizontal line L3 is performed for the period from the point of time t14 to the point of time t16.

When the exposure operations in accordance with a linear characteristic concerning the horizontal lines L1 through L3 are completed, an exposure operation in accordance with a logarithmic characteristic is performed concerning the horizontal line L1 for a period from the point of time t15 to the point of time t16 in the similar manner as the exposure operation in accordance with a linear characteristic. Logarithmic characteristic image signals obtained by the exposure operation in accordance with a logarithmic characteristic are outputted to the horizontal scanner 330a for holding. Then, the logarithmic characteristic image signals are amplified with a predetermined gain by the amplifier 373, and outputted for a period from the point of time t16 to the point of time t18. Similarly to the horizontal line L1, exposure and readout control is performed with respect to the horizontal lines L2 and L3. Thus, following the output of the logarithmic characteristic image signals concerning the horizontal line L1, logarithmic characteristic image signals concerning the horizontal line L2, and logarithmic characteristic image signals concerning the horizontal line L3 are sequentially outputted. In other words, the logarithmic characteristic image signal output operation concerning the horizontal lines L1 through L3 is sequentially executed in such a manner that the logarithmic characteristic image signal output operation concerning the horizontal line L1 is performed for the period from the point of time t16 to the point of time t18; the logarithmic characteristic image signal output operation concerning the horizontal line L2 is performed for the period from the point of time t18 to the point of time t20; and the logarithmic characteristic image signal output operation is performed for the period from the point of time t20 to the point of time t21.

In this way, an exposure operation in accordance with a linear characteristic, and an image signal output operation with respect to each of the horizontal lines are sequentially performed with respect to all the horizontal lines i.e. all the pixel rows in the pixel section 31. Likewise, an exposure operation in accordance with a logarithmic characteristic, and an image signal output operation with respect to each of the horizontal lines are sequentially performed with respect to all the horizontal lines in the pixel section 31.

Figure 13:
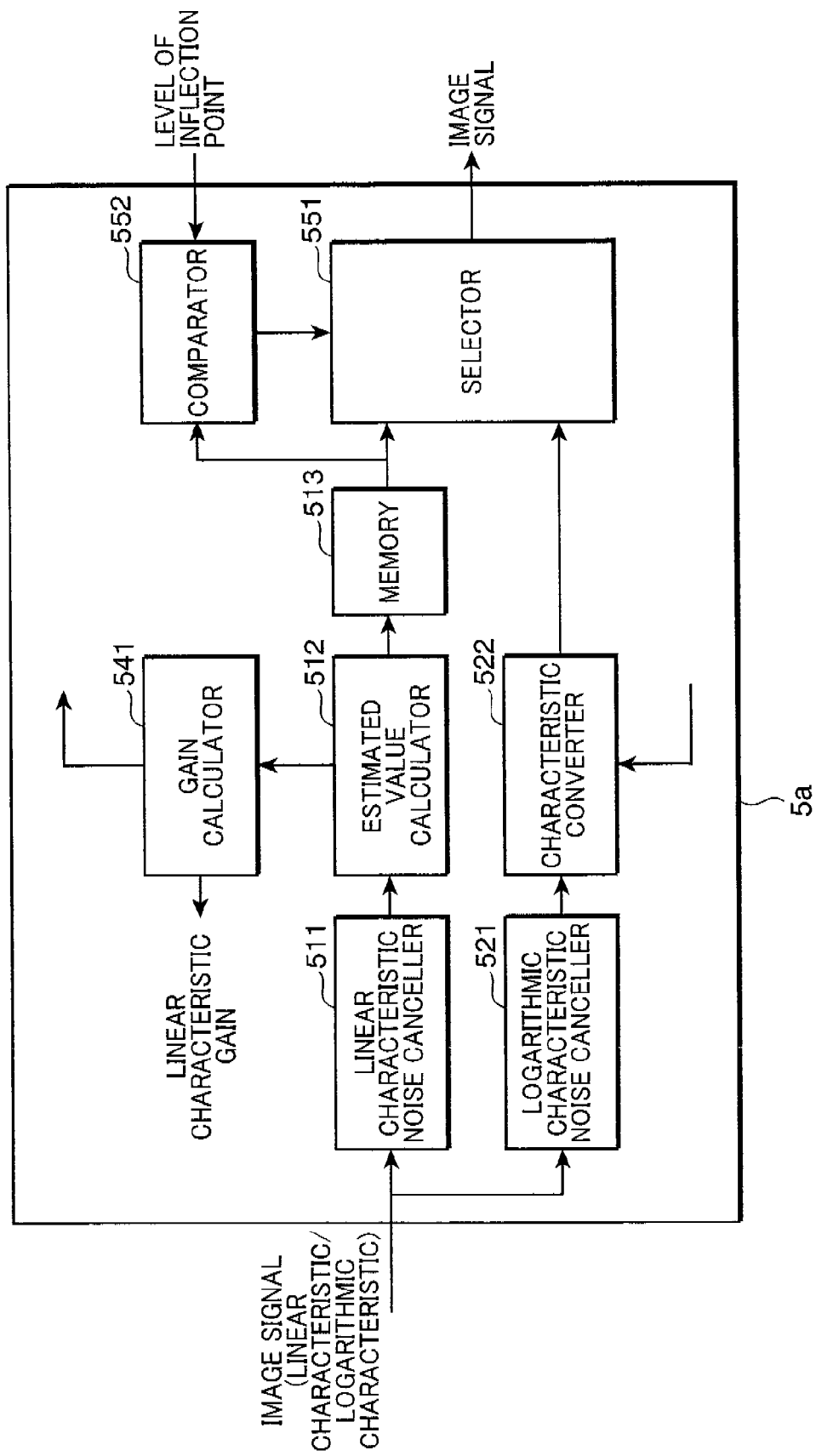
FIG. 13 is a functional block diagram of the image processor shown in FIG. 10 in the case where a linear characteristic and a logarithmic characteristic are provided as different photoelectric conversion characteristics.

FIG. 13 is a functional block diagram primarily on a sensitivity control operation to be performed by the image processor 5a, in the case where the sensitivity control operation i.e. a sensitivity correcting operation using image signals having the respective characteristics is performed by utilizing the arrangement shown in FIG. 10. The image processor 5a is primarily different from the image processor 5 in that the image processor 5a additionally includes a memory 513. Specifically, since a linear characteristic image signal and a logarithmic characteristic image signal are alternately inputted with respect to each frame, the image processor 5a changes an image processing operation in accordance with the image signals having the respective characteristics to be inputted with respect to each frame. In the case where a linear characteristic image signal is inputted, a linear characteristic noise canceller 511 performs a noise removal operation, an estimated value calculator 512 and a gain calculator 541 calculate a linear characteristic gain based on the estimated value, and the linear characteristic image signal is stored in the memory 513. In the case where a logarithmic characteristic image signal is inputted, the linear characteristic image signal stored in the memory 513 is read out. Then, the readout linear characteristic image signal, and a logarithmic characteristic image signal which has undergone noise removal by a logarithmic characteristic noise canceller 521 and characteristic conversion by a characteristic converter 522 are inputted to a selector 551. Then, the selector 551 selects an image signal, out of the linear characteristic image signal and the logarithmic characteristic image signal, in accordance with the level of the linear characteristic image signal. The selecting operation to be performed by the selector 551 in the second embodiment is substantially the same as the selecting operation to be performed by the selector 551 in the first embodiment.

Similarly to the first embodiment, the gain of an image signal to be used in the digital camera 1 having the above arrangement is controlled in such a manner that the gain of a linear characteristic image signal and the gain of a logarithmic characteristic image signal are set at a different value from each other, specifically that the gain of a linear characteristic image signal is controllable based on the estimated value obtained merely from the linear characteristic image signal.

In the foregoing embodiments, there is used the image sensor 3 (3a), as a linear-logarithmic sensor having a linear characteristic as a photoelectric conversion characteristic in a low luminance range, and a logarithmic characteristic as a photoelectric conversion characteristic in a high luminance range. Alternatively, for instance, the image sensor 3 (3a) may be a sensor (called as a "linear-linear sensor") having a linear characteristic as a photoelectric conversion characteristic both in a low luminance range and a high luminance range. In other words, the image sensor 3 (3a) may be a sensor having a photoelectric conversion characteristic comprised of a first linear characteristic and a second linear characteristic whose gradient on a graph is different from each other i.e. an exposure time or a like parameter is different from each other. The first linear characteristic and the second linear characteristic respectively correspond to the linear characteristic and the logarithmic characteristic in the foregoing embodiments, wherein the gradient of the first linear characteristic is larger than the gradient of the second linear characteristic. In the modification, an image having the second linear characteristic is sensed with a lower sensitivity i.e. with a shorter exposure time, as compared with an image having the first linear characteristic. In other words, the first linear characteristic corresponds to a linear photoelectric conversion characteristic having a high sensitivity i.e. a linear photoelectric conversion characteristic obtained by a longer exposure time, and the second linear characteristic corresponds to a linear photoelectric conversion characteristic having a low sensitivity i.e. a linear photoelectric conversion characteristic obtained by a shorter exposure time.

Figure 14:
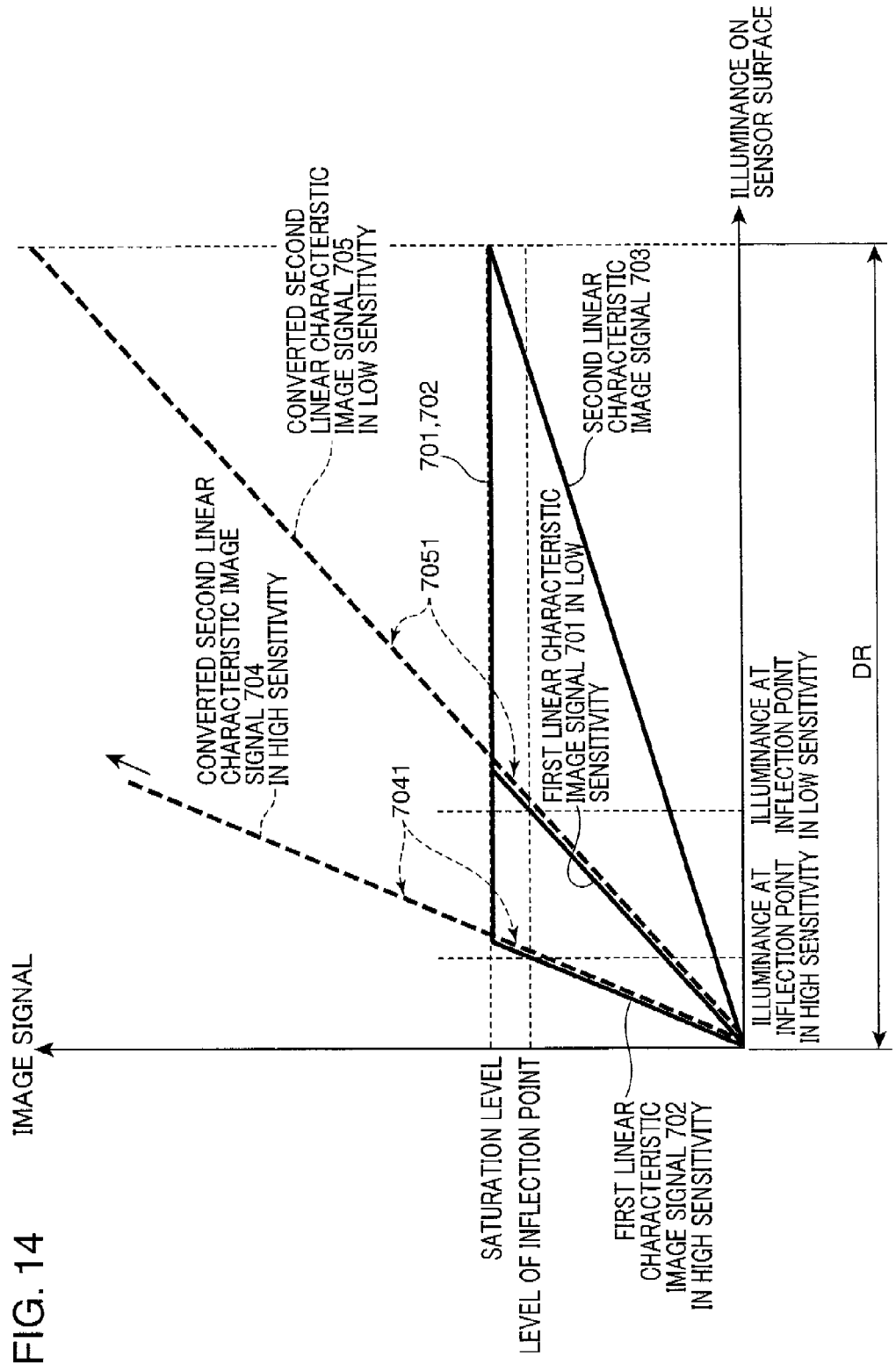
FIG. 14 is a graph for describing a selecting operation to be performed by the selector in the image processor with respect to image signals having different photoelectric conversion characteristics, in the case where a first linear characteristic and a second linear characteristic are provided as different photoelectric conversion characteristics, as a modification of the first and the second embodiments.

For instance, as shown in FIG. 14, an image signal having the first linear characteristic corresponds to a first linear characteristic image signal 701 and a first linear characteristic image signal 702; and an image having the second linear characteristic corresponds to a second linear characteristic image signal 703. A converted second linear characteristic image signal 704 is obtained by subjecting the second linear characteristic image signal 703 to characteristic conversion in accordance with a low sensitivity gain. A converted second linear characteristic image signal 705 is obtained by subjecting the second linear characteristic image signal 703 to characteristic conversion in accordance with a high sensitivity gain.

Similarly to the arrangement shown in FIG. 8, in the case where the sensitivity of the digital camera 1 is in a low sensitivity range, the first linear characteristic image signal 701, and an image signal component 7051 in the converted second linear characteristic image signal 705 corresponding to a range from the level of the inflection point to the maximum value of the dynamic range are selected, while using the level of the inflection point i.e. an illuminance at the inflection point in the case where the sensitivity of the digital camera 1 is in the low sensitivity range, as a switching point. In the case where the sensitivity of the digital camera 1 is in a high sensitivity range, the first linear characteristic image signal 702, and an image signal component 7041 in the converted second linear characteristic image signal 704 corresponding to a range from the level of the inflection point to the maximum value of the dynamic range are selected, while using the level of the inflection point i.e. an illuminance at the inflection point in the case where the sensitivity of the digital camera 1 is in the high sensitivity range, as a switching point. Then, the selector 551 synthesizes the selected image signal components, and outputs the synthesis result as a single image. Similarly to the foregoing embodiments, in the above arrangement, the gain of the first linear characteristic as the photoelectric conversion characteristic with which at least an image in a low luminance range is sensed, is calculated by using the estimated value obtained merely from the image signal having the photoelectric conversion characteristic in the low luminance range. Then, an amplification operation is performed merely with respect to an image signal representing an image of a lowest luminance after image generation e.g. with respect to an image signal having a photoelectric conversion characteristic in the low luminance range in this example.

As described above, the digital camera 1 in the foregoing embodiments includes: the image sensor 3 (3a) having two or more different photoelectric conversion characteristics, and adapted to output image signals having the respective photoelectric conversion characteristics individually; an amplifying section i.e. the first and the second amplifiers 371 and 372, the amplifier 373, and the amplifiers 354 and 364 for amplifying the image signals having the respective photoelectric conversion characteristics; a gain controlling section i.e. the first and the second characteristic image processors 51 and 52, and the first and the second characteristic gain calculators 53 and 54 for controlling a gain of the amplifying section; and an image generating section i.e. the synthesizer 55, and the selector 551 and the comparator 552 for synthesizing the amplified image signals having the respective photoelectric conversion characteristics to generate an image, wherein the gain controlling section calculates the gain of the image signals having the respective photoelectric conversion characteristics based on the image signals having the respective photoelectric conversion characteristics to control the gain of the amplifying section by using the calculated gain with respect to each of the photoelectric conversion characteristics.

In the above arrangement, the gain of the image signals having the respective photoelectric conversion characteristics is individually settable at a different value. In other words, an amplification operation can be performed individually with respect to the image signals having the different photoelectric conversion characteristics. In this arrangement, for instance, the gain of a linear characteristic image signal can be controlled based on an estimated value obtained merely from the linear characteristic image signal having a linear characteristic whose sensitivity is higher than that of a logarithmic characteristic. In other words, gain control can be performed in such a manner that an amplification operation is executed merely with respect to an image signal having a linear characteristic. As a result of the gain control, an image is generated by synthesizing the amplified image signal having the linear characteristic as a photoelectric conversion characteristic, and an image signal having a photoelectric conversion characteristic which has not undergone amplification. This enables to control the imaging sensitivity without changing the dynamic range i.e. correct the sensitivity of the digital camera.

Preferably, the gain controlling section controls the gain of the amplifying section by using at least the gain of the image signal having the photoelectric conversion characteristic whose sensitivity is highest, out of the two or more different photoelectric conversion characteristics. In this arrangement, an image is generated by synthesizing the amplified image signal having the photoelectric conversion characteristic with the highest sensitivity, and an image signal having a photoelectric conversion characteristic which has not undergone amplification. This enables to easily and securely control the imaging sensitivity without changing the dynamic range.

Preferably, the photoelectric conversion characteristics of the image sensor 3 (3a) include a linear characteristic and a logarithmic characteristic. In this arrangement, by amplifying the image signal having the linear characteristic as the photoelectric conversion characteristic with the highest sensitivity, and synthesizing the amplified image signal and an image signal having a logarithmic characteristic which has not undergone amplification, the imaging sensitivity can be controlled without changing the dynamic range, even in use of a solid-state image sensor i.e. a linear-logarithmic sensor having a linear characteristic and a logarithmic characteristic.

Preferably, the gain controlling section calculates the gain of the image signal having the linear characteristic based on the image signal having the linear characteristic to control the gain of solely the image signal representing an image having a lowest luminance after the image generation by using the calculated gain. In this arrangement, an image is generated by synthesizing the image signal representing the image having the lowest luminance after the image generation e.g. a linear characteristic image signal, and an image signal having a photoelectric conversion characteristic which has not undergone amplification i.e. a logarithmic characteristic image signal. This enables to control the imaging sensitivity without changing the dynamic range.

Preferably, the photoelectric conversion characteristics of the image sensor 3 (3a) include two or more linear characteristics whose sensitivity is different from each other. In this arrangement, by amplifying the image signal having the linear characteristic with the highest sensitivity, and synthesizing the amplified image signal and a linear characteristic image signal which has not undergone amplification, the imaging sensitivity can be controlled without changing the dynamic range, even in use of a solid-state image sensor having two or more linear characteristics whose sensitivity is different from each other.

Preferably, the gain controlling section calculates the gain of the image signal having the linear characteristic whose sensitivity is highest, out of the two or more linear characteristics based on the image signal having the linear characteristic with the highest sensitivity to control the gain of solely the image signal representing an image having a lowest luminance after the image generation by using the calculated gain. In this arrangement, an image is generated by synthesizing the amplified image signal representing the image having the lowest luminance after the image generation e.g. a linear characteristic image signal having the highest sensitivity, and a linear characteristic image signal which has not undergone amplification. This enables to control the imaging sensitivity without changing the dynamic range. Also, since all the different photoelectric conversion characteristics are linear characteristics, there is no need of converting a logarithmic characteristic into a linear characteristic in generating an image by synthesizing the image signals having the respective characteristics. This enables to easily control the imaging sensitivity without changing the dynamic range.

Preferably, the image generating section selects a signal component of a first image signal whose signal level is equal to or lower than a predetermined signal level, and a signal component of a second image signal whose signal level is higher than the predetermined signal level to synthesize the selected signal component of the first image signal and the selected signal component of the second image signal so as to generate an image, the first image signal having the photoelectric conversion characteristic which has undergone the gain control, and the second image signal being obtained by subjecting the image signal having the photoelectric conversion characteristic other than the photoelectric conversion characteristic which has undergone the gain control, to data conversion in accordance with the calculated gain. This arrangement enables to easily generate an image by synthesizing the image signals having the respective characteristics, without changing the dynamic range, by setting the predetermined signal level to the level of an inflection point between the photoelectric conversion characteristics, or a like level.

The following modifications are applicable to the invention, in addition to the foregoing embodiments.

(A) In the foregoing embodiments, the amplification operation i.e. increase of sensitivity is performed by analog processing by the first and the second amplifiers 371 and 372, or the amplifier 373. Alternatively, the amplification operation may be performed by digital processing e.g. an operation using digital data in the image processor 5 (5a). The modification enables to simplify the configuration of the digital camera, because there is no need of providing an analog amplifier for amplifying an analog signal, a gain controller for controlling the gain of the analog amplifier, or a like device.

Figure 15:
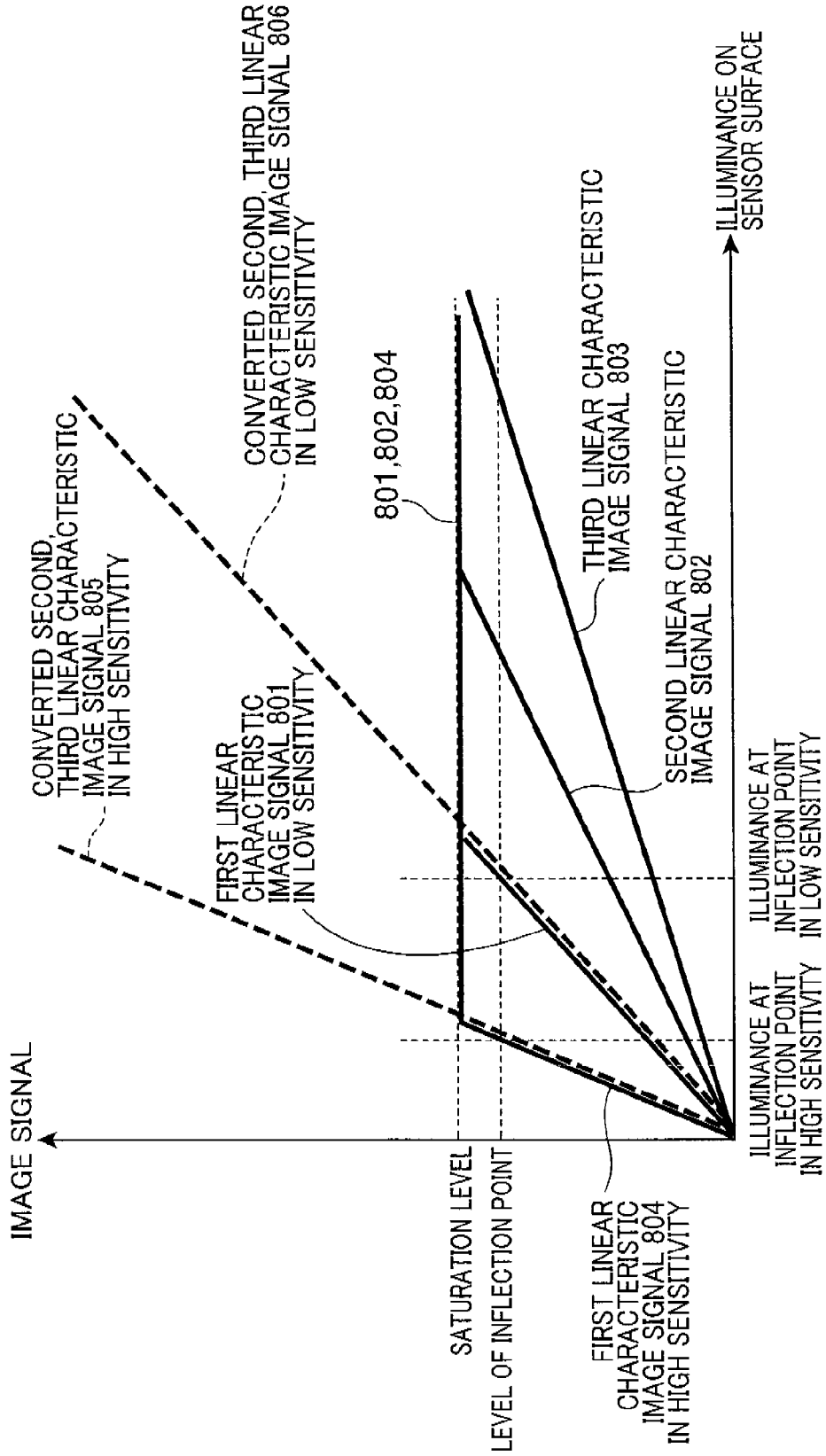
FIG. 15 is a graph for describing a selecting operation to be performed by the selector in the image processor with respect to image signals having different photoelectric conversion characteristics, in the case where three or more linear characteristics are provided as different photoelectric conversion characteristics, as another modification of the first and the second embodiments.

(B) In the foregoing embodiments, two different characteristics i.e. a linear characteristic and a logarithmic characteristic, or a first linear characteristic and a second linear characteristic are provided as the photoelectric conversion characteristics. Alternatively, three or more different characteristics may be provided as the photoelectric conversion characteristics. In the modification, as shown in FIG. 15, the selector 55 performs an operation of selecting from image signals having e.g. three kinds of photoelectric conversion characteristics i.e. a first linear characteristic image signal 801, a second linear characteristic image signal 802, and a third linear characteristic image signal 803. Specifically, the sensitivity of the image signal having a highest sensitivity among the three image signals 801, 802, and 803 is controlled, in other words, the gain of the image signal having the highest sensitivity is changed. Further, data conversion i.e. lookup table conversion or characteristic conversion is performed in such a manner that the gain (i.e. the gradient on the graph) of the image signal subjected to sensitivity control is coincident with the gains of the remaining two image signals. Then, a selecting operation is performed with respect to the three image signals 801, 802, and 803.

A first linear characteristic image signal 804 with an increased sensitivity is obtained by changing the gain of the first linear characteristic image signal 801 whose sensitivity is the highest among the three image signals 801, 802, and 803. A converted second and third linear characteristic image signal 806 is an image signal obtained by subjecting the second linear characteristic image signal 802 and the third linear characteristic image signal 803 to characteristic conversion in accordance with the gain of the first linear characteristic image signal 801, respectively. A converted second and third linear characteristic image signal 805 is an image signal obtained by subjecting the second linear characteristic image signal 802 and the third linear characteristic image signal 803 to characteristic conversion in accordance with the gain of the first linear characteristic image signal 804, respectively.

In the above modification, similarly to the foregoing embodiments, in the case where the sensitivity of the digital camera is in a low sensitivity range, the first linear characteristic image signal 801, and a signal component in the converted second and third linear characteristic image signal 806 corresponding to a range from the level of the inflection point to the maximum value of the dynamic range are selected, while using the level of the inflection point i.e. an illuminance at the inflection point in the case where the sensitivity of the digital camera is in the low sensitivity range, as a switching point. In the case where the sensitivity of the digital camera is in a high sensitivity range, the first linear characteristic image signal 804, and a signal component in the converted second and third linear characteristic image signal 805 corresponding to a range from the level of the inflection point to the maximum value of the dynamic range are selected, while using the level of the inflection point i.e. an illuminance at the inflection point in the case where the sensitivity of the digital camera is in the high sensitivity range, as a switching point. The selected signal components are synthesized by the selector 551 for output. In the case where the above modification is applied to the first embodiment, three horizontal scanners or three amplifiers are required in correspondence to the three photoelectric conversion characteristics. On the other hand, in the case where the above modification is applied to the second embodiment, an arrangement is required for performing an exposure operation in accordance with the different photoelectric conversion characteristics, and an image signal output operation with respect to three frame images. In the case where four or more different photoelectric conversion characteristics are provided, similarly to the foregoing arrangement, the gain is changed merely with respect to an image signal having a photoelectric conversion characteristic with a highest sensitivity, and the remaining photoelectric conversion characteristics are subjected to data conversion in accordance with the gain of the image signal having the photoelectric conversion characteristic with the highest sensitivity. Then, a selecting operation is performed with respect to the image signals.

(C) The digital camera 1 may be configured in such a manner that an image is sensed in accordance with three or more different photoelectric conversion characteristics e.g. the first through the third linear characteristics shown in the modification (B) (see FIG. 14); and the gain of an image signal i.e. two linear characteristic image signals in the low luminance range, or the first linear characteristic image signal and the second linear characteristic image signal whose sensitivity is higher than the sensitivity of the third linear characteristic image signal, other than an image signal representing an image having a highest luminance after image generation i.e. the third linear characteristic image signal having a lowest sensitivity is controlled by using a linear characteristic gain calculated by a gain calculator. In the modification, the linear characteristic gain is calculated based on the first linear characteristic signal and/or the second linear characteristic image signal. Also, in the modification, similarly to the foregoing arrangement, the third linear characteristic image signal is subjected to data conversion in such a manner that the gain of the third linear characteristic image signal is coincident with the gains of the first linear characteristic image signal and the second linear characteristic image signal which have undergone gain control.

As described above, the gain controlling section controls the gain of the image signal other than the image signal representing the image having the highest luminance after the image generation, by using the gains of the image signals having the respective photoelectric conversion characteristics calculated based on the image signals having the respective photoelectric conversion characteristics. In this arrangement, an image is generated by synthesizing the image signal i.e. the image signal in the low luminance range other than the amplified image signal representing the image having the highest luminance after the image generation, and the image signal which has not undergone amplification i.e. the image signal having the highest luminance or the lowest sensitivity. This enables to control the imaging sensitivity without changing the dynamic range.

(D) In the foregoing embodiments, the amplifiers are provided in the image sensor 3 (3*a*). Alternatively, the amplifiers may be provided outside the image sensor 3 (3*a*) In the foregoing embodiments, the A/D converter 4 is provided outside the image sensor 3 (3*a*). Alternatively, the A/D converter 4 may be provided inside the image sensor 3 (3*a*) e.g. in the vertical output circuits 350 and 360.

The specification discloses the aforementioned arrangements. The following is a summary of the primary arrangements of the embodiments.

An image sensing apparatus according to an aspect of the invention comprises: an image sensor having two or more different photoelectric conversion characteristics, and adapted to output image signals having the respective photoelectric conversion characteristics individually; an amplifying section for amplifying the image signals having the respective photoelectric conversion characteristics; a gain controlling section for controlling a gain of the amplifying section; and an output section for outputting the image signals having the respective photoelectric conversion characteristics amplified by the amplifying section, wherein the gain controlling section calculates a gain of the image signals having the respective photoelectric conversion characteristics based on the image signals having the respective photoelectric conversion characteristics to control the gain of the amplifying section by using the calculated gain with respect to each of the photoelectric conversion characteristics.

An image sensing method according to another aspect of the invention comprises a step of outputting, from an image sensor having two or more different photoelectric conversion characteristics, image signals having the photoelectric conversion characteristics individually; a step of amplifying the image signals having the respective photoelectric conversion characteristics; a step of controlling a gain in the amplifying step; and a step of outputting the image signals having the respective photoelectric conversion characteristics amplified in the amplifying step, wherein the gain controlling step includes a step of calculating a gain of the image signals having the respective photoelectric conversion characteristics based on the image signals having the respective photoelectric conversion characteristics, and a step of controlling the gain in the amplifying step by using the gain obtained in the gain calculating step with respect to each of the photoelectric conversion characteristics.

In the above arrangement, the gain of the image signals having the respective photoelectric conversion characteristics is individually settable at a different value. In other words, an amplification operation can be performed individually with respect to the image signals having the different photoelectric conversion characteristics. In this arrangement, for instance, the gain of a linear characteristic image signal can be controlled based on an estimated value obtained merely from the linear characteristic image signal having a linear characteristic whose sensitivity is higher than that of a logarithmic characteristic. In other words, the above arrangement enables to perform gain control of performing an amplification operation i.e. perform sensitivity correction merely with respect to an image signal having a linear characteristic.

Preferably, the image sensing apparatus may further comprise an image generating section for synthesizing the image signals outputted from the output section to generate an image.

In the above arrangement, an image is generated by the image generating section by synthesizing the amplified image signal having the linear characteristic as a photoelectric conversion characteristic, and an image signal having a photoelectric conversion characteristic which has not undergone amplification. This enables to control the imaging sensitivity without changing the dynamic range.

Preferably, the gain controlling section may control the gain of the amplifying section by using at least the gain of the image signal having the photoelectric conversion characteristic whose sensitivity is highest, out of the two or more different photoelectric conversion characteristics.

In the above arrangement, an image is generated by synthesizing the amplified image signal having the photoelectric conversion characteristic with the highest sensitivity, and an image signal having a photoelectric conversion characteristic which has not undergone amplification. This enables to easily and securely control the imaging sensitivity without changing the dynamic range.

Preferably, the photoelectric conversion characteristics of the image sensor may include a linear characteristic and a logarithmic characteristic.

In the above arrangement, by amplifying the image signal having the linear characteristic as the photoelectric conversion characteristic with the highest sensitivity, and synthesizing the amplified image signal and an image signal having a logarithmic characteristic which has not undergone amplification, the imaging sensitivity can be controlled without changing the dynamic range, even in use of a solid-state image sensor having a linear characteristic and a logarithmic characteristic.

Preferably, the gain controlling section may calculate the gain of the image signal having the linear characteristic based on the image signal having the linear characteristic to control the gain of solely the image signal representing an image having a lowest luminance after the image generation by using the calculated gain.

In the above arrangement, an image is generated by synthesizing the image signal representing the image having the lowest luminance after the image generation e.g. a linear characteristic image signal, and an image signal having a photoelectric conversion characteristic which has not undergone amplification i.e. a logarithmic characteristic image signal. This enables to control the imaging sensitivity without changing the dynamic range.

Preferably, the photoelectric conversion characteristics of the image sensor may include two or more linear characteristics whose sensitivity is different from each other.

In the above arrangement, by amplifying the image signal having the linear characteristic with the highest sensitivity, and synthesizing the amplified image signal and a linear characteristic image signal which has not undergone amplification, the imaging sensitivity can be controlled without changing the dynamic range in use of a solid-state image sensor having two or more linear characteristics whose sensitivity is different from each other.

Preferably, the gain controlling section may calculate the gain of the image signal having the linear characteristic whose sensitivity is highest, out of the two or more linear characteristics, based on the image signal having the linear characteristic with the highest sensitivity to control the gain of solely the image signal representing an image having a lowest luminance after the image generation by using the calculated gain.

In the above arrangement, an image is generated by synthesizing the amplified image signal representing the image having the lowest luminance after the image generation e.g. a linear characteristic image signal having a highest sensitivity, and a linear characteristic image signal which has not undergone amplification. This enables to control the imaging sensitivity without changing the dynamic range. Also, since all the different photoelectric conversion characteristics are linear characteristics, there is no need of converting a logarithmic characteristic into a linear characteristic in generating an image by synthesizing the image signals having the respective characteristics. This enables to easily control the imaging sensitivity without changing the dynamic range.

Preferably, the image generating section may select a signal component of a first image signal whose signal level is equal to or lower than a predetermined signal level, and a signal component of a second image signal whose signal level is higher than the predetermined signal level to synthesize the selected signal component of the first image signal and the selected signal component of the second image signal so as to generate an image, the first image signal having the photoelectric conversion characteristic which has undergone the gain control, and the second image signal being obtained by subjecting the image signal having the photoelectric conversion characteristic other than the photoelectric conversion characteristic which has undergone the gain control, to data conversion in accordance with the calculated gain.

The above arrangement enables to easily generate an image by synthesizing the image signals having the respective characteristics, without changing the dynamic range, by setting the predetermined signal level to the level of an inflection point between the photoelectric conversion characteristics, or a like level.

Preferably, the gain controlling section may control the gain of the image signal other than the image signal representing an image having a highest luminance after image generation by using the calculated gain.

In the above arrangement, an image is generated by synthesizing an image signal i.e. an image signal in a low luminance range, other than the amplified image signal representing the image having the highest luminance after the image generation, and an image signal which has not undergone amplification i.e. an image signal having a highest luminance or a lowest sensitivity. This enables to control the imaging sensitivity without changing the dynamic range.

Although the present invention has been fully described by way of example with reference to the accompanying drawings, it is to be understood that various changes and modifications will be apparent to those skilled in the art. Therefore, unless otherwise such changes and modifications depart from the scope of the present invention hereinafter defined, they should be construed as being included therein.

What is claimed is:

1. An image sensing apparatus, comprising:
an image sensor having two or more different photoelectric conversion characteristics, and adapted to output image signals having the respective photoelectric conversion characteristics individually;
an amplifying section for amplifying the image signals having the respective photoelectric conversion characteristics;
a gain controlling section for controlling a gain of the amplifying section;
an output section for outputting the image signals having the respective photoelectric conversion characteristics amplified by the amplifying section; and
an image generating section for synthesizing the image signals outputted from the output section to generate an image, wherein
the gain controlling section calculates a gain of the image signals having the respective photoelectric conversion characteristics based on the image signals having the respective photoelectric conversion characteristics to control the gain of the amplifying section by using the calculated gain with respect to each of the photoelectric conversion characteristics, and
the photoelectric conversion characteristics of the image sensor include two or more linear characteristics whose sensitivity is different from each other.

2. The image sensing apparatus according to claim 1, wherein
the gain controlling section controls the gain of the amplifying section by using at least the gain of the image signal having the photoelectric conversion characteristic whose sensitivity is highest, out of the two or more different photoelectric conversion characteristics.

3. The image sensing apparatus according to claim 1, wherein the photoelectric conversion characteristics of the image sensor include a linear characteristic and a logarithmic characteristic.

4. The image sensing apparatus according to claim 3, wherein
the gain controlling section calculates the gain of the image signal having the linear characteristic based on the image signal having the linear characteristic to control the gain of solely the image signal representing an image having a lowest luminance after the image generation by using the calculated gain.

5. The image sensing apparatus according to claim 1, wherein
the gain controlling section calculates the gain of the image signal having the linear characteristic whose sensitivity is highest, out of the two or more linear characteristics, based on the image signal having the linear characteristic with the highest sensitivity to control the gain of solely the image signal representing an image having a lowest luminance after the image generation by using the calculated gain.

6. The image sensing apparatus according to claim 5, wherein
the image generating section selects a signal component of a first image signal whose signal level is equal to or lower than a predetermined signal level, and a signal component of a second image signal whose signal level is higher than the predetermined signal level to synthesize the selected signal component of the first image signal and the selected signal component of the second image signal so as to generate an image, the first image signal having the photoelectric conversion characteristic which has undergone the gain control, and the second image signal being obtained by subjecting the image signal having the photoelectric conversion characteristic other than the photoelectric conversion characteristic which has undergone the gain control, to data conversion in accordance with the calculated gain.

7. The image sensing apparatus according to claim 1, wherein
the gain controlling section controls the gain of the image signal other than the image signal representing an image having a highest luminance after image generation by using the calculated gain.

8. An image sensing apparatus, comprising:
an image sensor having two or more different photoelectric conversion characteristics, and adapted to output image signals having the respective photoelectric conversion characteristics individually;
an amplifying section for amplifying the image signals having the respective photoelectric conversion characteristics;
a gain controlling section for controlling a gain of the amplifying section;
an output section for outputting the image signals having the respective photoelectric conversion characteristics amplified by the amplifying section; and
an image generating section for synthesizing the image signals outputted from the output section to generate an image, wherein
the gain controlling section calculates a gain of the image signals having the respective photoelectric conversion characteristics based on the image signals having the respective photoelectric conversion characteristics to control the gain of the amplifying section by using the calculated gain with respect to each of the photoelectric conversion characteristics, the photoelectric conversion characteristics of the image sensor include a linear characteristic and a logarithmic characteristic, the gain controlling section calculates the gain of the image signal having the linear characteristic based on the image signal having the linear characteristic to control the gain of solely the image signal representing an image having a lowest luminance after the image generation by using the calculated gain, and the image generating section selects a signal component of a first image signal whose signal level is equal to or lower than a predetermined signal level, and a signal component of a second image signal whose signal level is higher than the predetermined signal level to synthesize the selected signal component of the first image signal and the selected signal component of the second image signal so as to generate an image, the first image signal having the photoelectric conversion characteristic which has undergone the gain control, and the second image signal being obtained by subjecting the image signal having the photoelectric conversion characteristic other than the photoelectric conversion characteristic which has undergone the gain control, to data conversion in accordance with the calculated gain.

9. An image sensing method, comprising:

a step of outputting, from an image sensor having two or more different photoelectric conversion characteristics, image signals having the photoelectric conversion characteristics individually;

a step of amplifying the image signals having the respective photoelectric conversion characteristics;

a step of controlling a gain in the amplifying step; and a step of outputting the image signals having the respective photoelectric conversion characteristics amplified in the amplifying step, wherein the gain controlling step includes a step of calculating a gain of the image signals having the respective photoelectric conversion characteristics based on the image signals having the respective photoelectric conversion characteristics, and a step of controlling the gain in the amplifying step by using the gain obtained in the gain calculating step with respect to each of the photoelectric conversion characteristics, wherein the photoelectric conversion characteristics of the image sensor include two or more linear characteristics whose sensitivity is different from each other.

10. The image sensing method according to claim 9, wherein the gain controlling step includes a step of controlling the gain in the amplifying step by using at least the gain of the image signal having the photoelectric conversion characteristic whose sensitivity is highest, out of the two or more different photoelectric conversion characteristics.

11. The image sensing method according to claim 9, wherein the photoelectric conversion characteristics of the image sensor include a linear characteristic and a logarithmic characteristic.

12. The image sensing method according to claim 11, wherein the gain controlling step includes a step of calculating the gain of the image signal having the linear characteristic based on the image signal having the linear characteristic, and a step of controlling the gain of solely the image signal representing an image having a lowest luminance after image generation by using the gain obtained in the gain calculating step.

13. The image sensing method according to claim 9, wherein the gain controlling step includes a step of calculating the gain of the image signal having the linear characteristic whose sensitivity is highest, out of the two or more linear characteristics, based on the image signal having the linear characteristic with the highest sensitivity, and a step of controlling the gain of solely the image signal representing an image having a lowest luminance after image generation by using the gain obtained in the gain calculating step.

14. The image sensing method according to claim 9, wherein the gain controlling step includes a step of controlling the gain of the image signal other than the image signal representing an image having a highest luminance after image generation by using the gain obtained in the gain calculating step.

* * * * *